(12) United States Patent
Iijima

(10) Patent No.: US 12,080,507 B2
(45) Date of Patent: Sep. 3, 2024

(54) ELECTRON GUN, ELECTRON BEAM APPLICATOR, EMISSION AXIS VERIFICATION METHOD FOR ELECTRON BEAM EMITTED FROM PHOTOCATHODE, AND EMISSION AXIS ALIGNMENT METHOD FOR ELECTRON BEAM EMITTED FROM PHOTOCATHODE

(71) Applicant: Photo electron Soul Inc., Nagoya (JP)

(72) Inventor: Hokuto Iijima, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 250 days.

(21) Appl. No.: 17/763,186

(22) PCT Filed: Sep. 4, 2020

(86) PCT No.: PCT/JP2020/033515
§ 371 (c)(1),
(2) Date: Mar. 23, 2022

(87) PCT Pub. No.: WO2021/059918
PCT Pub. Date: Apr. 1, 2021

(65) Prior Publication Data
US 2022/0359146 A1   Nov. 10, 2022

(30) Foreign Application Priority Data

Sep. 24, 2019   (JP) .................... 2019-173319

(51) Int. Cl.
*H01J 3/02* (2006.01)
*H01J 1/34* (2006.01)
(Continued)

(52) U.S. Cl.
CPC ............ *H01J 3/021* (2013.01); *H01J 1/34* (2013.01); *H01J 1/52* (2013.01); *H01J 3/10* (2013.01);
(Continued)

(58) Field of Classification Search
None
See application file for complete search history.

(56) References Cited

U.S. PATENT DOCUMENTS 4,820,927 A * 4/1989 Langner ............... H01J 37/073
850/16
6,555,830 B1 * 4/2003 Mankos ............... H01J 37/073
250/311
(Continued)

FOREIGN PATENT DOCUMENTS

JP   S62 234849 A   10/1987
JP   H1-183044 A   7/1989
(Continued)

OTHER PUBLICATIONS

European Extended European Search Report, dated Oct. 21, 2022 for corresponding European application No. 20869775.5 (total 13 pages).
(Continued)

*Primary Examiner* — Ashok Patel
(74) *Attorney, Agent, or Firm* — Intellectual Property Law Group LLP; Juneko Jackson

(57) ABSTRACT

An object is to provide an electron gun that makes it possible to verify whether or not an electron beam emitted form a photocathode is misaligned from a designed emission center axis. The object can be achieved by an electron gun including: a light source; a photocathode; and an anode. The electron gun includes an intermediate electrode arranged between the photocathode and the anode, an electron beam shielding member configured to block a part of an electron beam, a measurement unit configured to measure an intensity of an electron beam blocked by the electron beam shielding member, and an electron beam emission direction deflector arranged between the anode and the electron beam shielding member and configured to change a position where
(Continued)

an electron beam that passed through the anode reaches the electron beam shielding member. The intermediate electrode has an electron beam passage hole and a drift space.

20 Claims, 11 Drawing Sheets

(51) Int. Cl.
    *H01J 1/52*     (2006.01)
    *H01J 3/10*     (2006.01)
    *H01J 37/073*     (2006.01)

(52) U.S. Cl.
    CPC ... *H01J 37/073* (2013.01); *H01J 2237/06333* (2013.01)

(56) References Cited

U.S. PATENT DOCUMENTS

| | | | |
|---|---|---|---|
| 11,195,685 B2 | 12/2021 | Iijima | |
| 2009/0218507 A1 | 9/2009 | Fujisawa et al. | |
| 2015/0255240 A1* | 9/2015 | Ichimura | H01J 9/025 |
| | | | 205/660 |
| 2016/0172144 A1 | 6/2016 | Nishitani | |
| 2021/0035766 A1 | 2/2021 | Nishitani et al. | |

FOREIGN PATENT DOCUMENTS

| | | |
|---|---|---|
| JP | 2001143648 A | 5/2001 |
| JP | 3537779 B2 | 3/2004 |
| JP | 2004134300 A | 4/2004 |
| JP | 2010125467 A | 6/2010 |
| JP | 5394763 B2 | 1/2014 |
| JP | 6466020 B1 | 2/2019 |
| JP | 2019150764 A | 9/2019 |
| WO | WO2015/008561 A1 | 1/2015 |
| WO | WO 2015/082295 A1 | 6/2015 |
| WO | WO2018/186294 A1 | 10/2018 |

OTHER PUBLICATIONS

International Search Report, dated Nov. 17, 2020 for corresponding International Application No. PCT/JP2020/033515 with English translation (5 pages).
Written Opinion of the ISA, dated Nov. 17, 2020 for corresponding International Application No. PCT/JP2020/033515 with English translation (10 pages).
Japan Office Action, dated Apr. 22, 2024 for corresponding Japanese application No. 2021-548743 (8 pages).

* cited by examiner

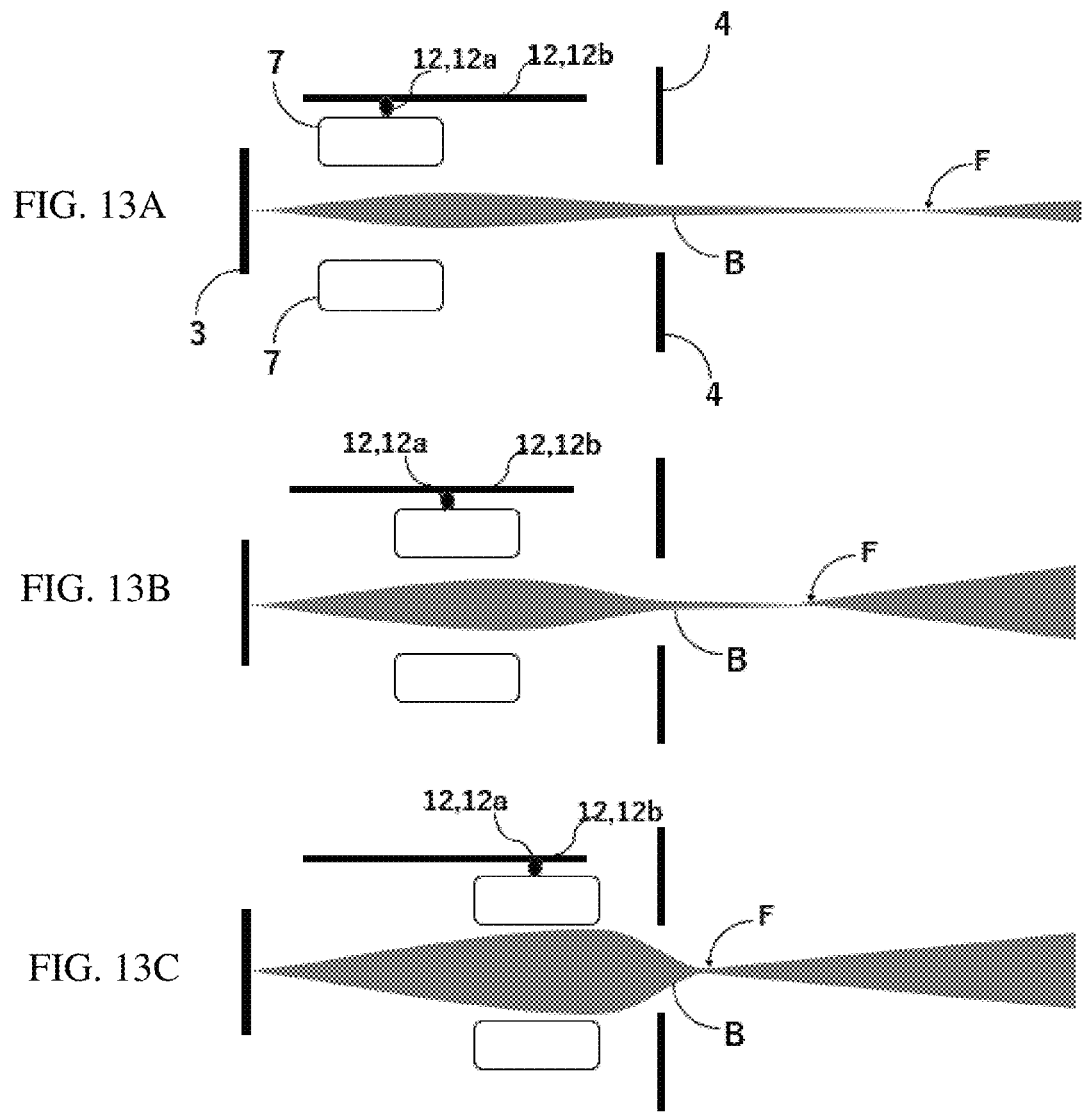

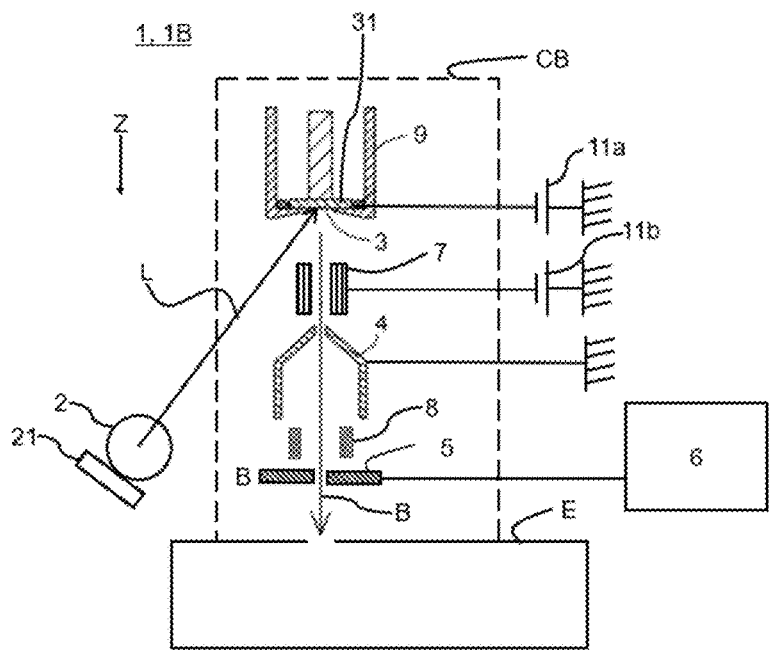
FIG. 14
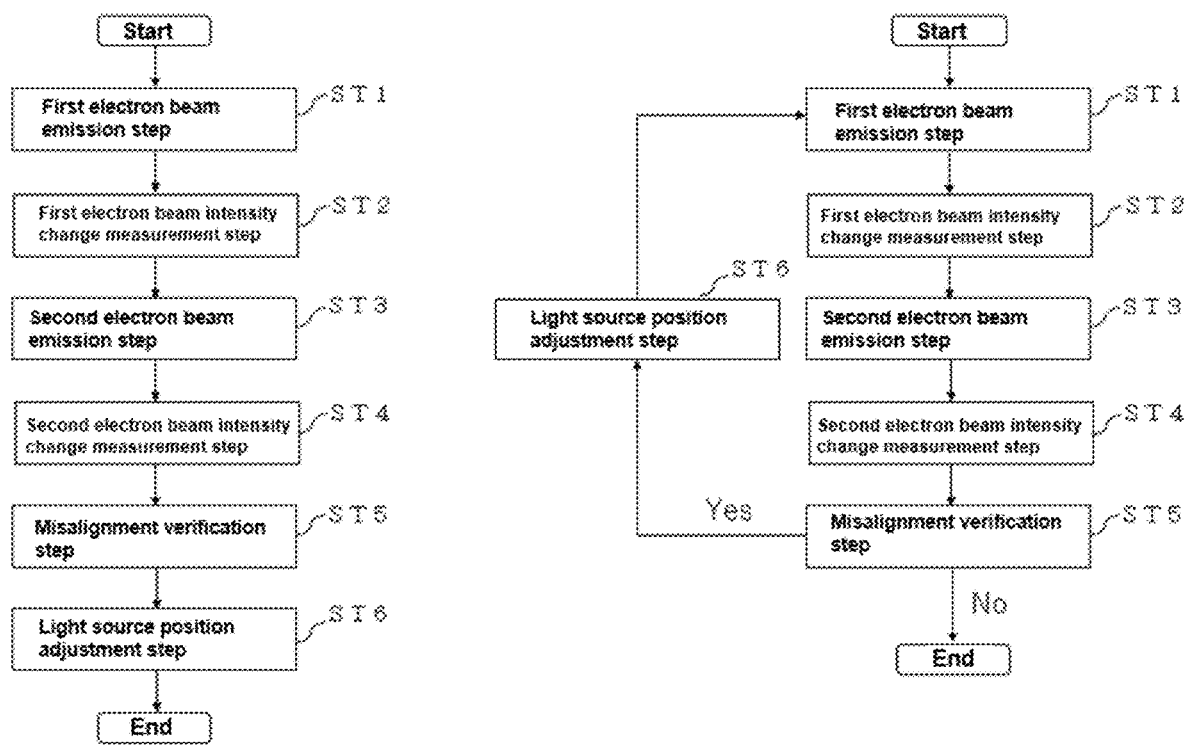
FIG. 15A
FIG. 15B

ELECTRON GUN, ELECTRON BEAM APPLICATOR, EMISSION AXIS VERIFICATION METHOD FOR ELECTRON BEAM EMITTED FROM PHOTOCATHODE, AND EMISSION AXIS ALIGNMENT METHOD FOR ELECTRON BEAM EMITTED FROM PHOTOCATHODE

CROSS-REFERENCE TO RELATED APPLICATIONS

This application is a U.S. National Phase application, under 35 U.S.C. § 371, of International Application no. PCT/JP2020/033515, with an international filing date of Sep. 4, 2020, and claims priority to Japanese application no. 2019-173319, filed on Sep. 24, 2019, each of which is hereby incorporated by reference for all purposes.

TECHNICAL FIELD

The disclosure of the present application relates to an electron gun, an electron beam applicator, an emission axis verification method for an electron beam emitted from a photocathode, and an emission axis alignment method for an electron beam emitted from a photocathode.

BACKGROUND ART

Devices such as an electron gun equipped with a photocathode, an electron microscope, a free electron laser accelerator, an inspection device, or the like including the electron gun (hereafter, a device including an electron gun may be simply referred to as a "device") are known (see Patent Literature 1).

A device having an electron gun is required to obtain a bright image and high resolution. Thus, such a device requires adjusting work for the emission axis of an electron beam emitted from an electron gun so that the electron beam emitted from the electron gun align with the optical axis of the electron optics of the device when the electron gun is initially mounted or when the electron gun is replaced. Further, also during normal operation, correction of axis misalignment of the electron beam is performed, when necessary, in order to correct misalignment between the electron beam emitted from an electron gun and the optical axis of the electron optics of the device caused by a temporal change or the like (hereafter, correction of axis misalignment of an electron beam may be referred to as "alignment").

While alignment is often operated manually after an electron gun is mounted to a device, many studies for automation of alignment have been made in recent years. As a related art, there is a method of automatically optimizing an incident axis of an electron beam relative to an anode electrode by driving a motor to perform a mechanical scan of an electron gun, adjusting the incident axis of the electron beam relative to an opening of an annular anode electrode, and automatically acquiring the optimal mechanical position of the electron gun when the amount of current passing through the opening of the anode electrode becomes the largest (see Patent Literature 2).

As another related art, there is also a method for a device that includes: an electron gun configured to emit an electron beam; a focusing coil configured to focuses the electron beam; an alignment component configured to cause the electron beam to enter the center of the focusing coil; and an alignment control unit having digital observation optics configured to observe an irradiation image of the electron beam, an image processing unit configured to process image data from the digital observation optics, and a control unit configured to control the electron gun, the focusing coil, and the alignment component based on processing data from the image processing unit. The control unit of the alignment control unit controls the electron gun and the focusing coil, irradiates a target with an electron beam in predetermined states with different focuses, and outputs an alignment control signal to the alignment component based on a correction value calculated from a difference between position coordinates of the irradiation images (see Patent Literature 3).

CITATION LIST

Patent Literature

Patent Literature 1: International Publication No. 2015/008561
Patent Literature 2: Japanese Patent No. 5394763
Patent Literature 3: Japanese Patent Application Laid-Open No. 2010-125467

SUMMARY OF INVENTION

Technical Problem

As electron guns, a thermionic emission type, a field emission type, and a Schottky type are conventionally known. Among these types, the thermionic emission type is superior in the amount of probe current, the stability of current, the price, and the like and are thus widely used in general purpose SEMs, EPMAs, Auger analyzers, and the like. Thus, most studies related to automation of alignment such as disclosure of Patent Literatures 2 and 3 are for thermionic emission type electron guns.

On the other hand, the electron gun equipped with a photocathode disclosed in Patent Literature 1 can emit a bright, sharp electron beam by irradiating the photocathode with excitation light. Thus, such electron guns have been developed in recent years. However, electron guns equipped with a photocathode are under development, and there is no known method to utilize a characteristic of the photocathode to verify whether or not there is misalignment of an electron beam emitted from a photocathode.

The present inventors have newly found through intensive studies that a combination of:
(1) an intermediate electrode arranged between a photocathode and an anode;
(2) an electron beam shielding member that can block a part of an electron beam;
(3) a measurement unit that measures the intensity of the electron beam blocked by the electron beam shielding member; and
(4) an electron beam emission direction deflector arranged between the anode and the electron beam shielding member and configured to change the position at which the electron beam that has passed through the anode reaches the electron beam shielding member,
(5) makes it possible to verify whether or not there is misalignment between the designed emission center axis of the electron beam inside the electron gun (hereafter, also referred to as "designed emission center axis") and the center axis of the electron beam actually emitted from the photocathode.

Accordingly, an object of the disclosure of the present application relates to an electron gun that can verify whether or not an electron beam emitted from a photocathode is misaligned from the designed emission center axis, an electron beam applicator equipped with the electron gun, an emission axis verification method for an electron beam emitted from a photocathode, and an emission axis alignment method for an electron beam emitted from a photocathode.

Solution to Problem

The present application relates to an electron gun, an electron beam applicator, an emission axis verification method for an electron beam emitted from a photocathode, and an emission axis alignment method for an electron beam emitted from a photocathode illustrated below.
(1) An electron gun comprising:
   a light source;
   a photocathode configured to emit an electron beam in response to receiving light from the light source; and
   an anode,
   wherein the electron gun includes
   an intermediate electrode arranged between the photocathode and the anode,
   an electron beam shielding member configured to block a part of an electron beam,
   a measurement unit configured to measure an intensity of an electron beam blocked by the electron beam shielding member, and
   an electron beam emission direction deflector arranged between the anode and the electron beam shielding member and configured to change a position where an electron beam that passed through the anode reaches the electron beam shielding member, and
   wherein the intermediate electrode has
   an electron beam passage hole through which an electron beam emitted from the photocathode passes through, and
   a drift space is formed in the electron beam passage hole such that, when an electric field is generated between the photocathode and the anode by application of a voltage, effect of the electric field can be disregarded.
(2) The electron gun according to (1) above further comprising: a light source position adjustment member configured to adjust a position of excitation light emitted to the photocathode; and/or a photocathode position adjustment member configured to adjust a position of the photocathode.
(3) The electron gun according to (1) or (2) above further comprising: a power supply device configured to change a value of voltage applied to the intermediate electrode; and/or a drive unit configured to adjust a position of the intermediate electrode, which is arranged between the photocathode and the anode, in a designed emission center axis direction of an electron beam.
(4) The electron gun according to any one of (1) to (3) above further comprising a calculation unit configured to calculate a misalignment between a designed emission center axis of an electron beam and an electron beam emitted from the photocathode in accordance with a measurement result measured by the measurement unit.
(5) The electron gun according to (4) above further comprising a control unit configured to control a light source position adjustment member and/or a photocathode position adjustment member in accordance with a calculation result calculated by the calculation unit.
(6) The electron gun according to any one of (1) to (5) above further comprising an electron beam deflector configured to deflect an electron beam that passed through the electron beam shielding member in order to align an incident axis of a counterpart device to which the electron gun is mounted with an emission direction of an electron beam emitted from the electron gun.
(7) An electron beam applicator comprising the electron gun according to any one of (1) to (6) above, wherein the electron beam applicator is:
   a free electron laser accelerator,
   an electron microscope,
   an electron holography device,
   an electron beam drawing device,
   an electron diffractometer,
   an electron beam inspection device,
   an electron beam metal additive manufacturing device,
   an electron beam lithography device,
   an electron beam processing device,
   an electron beam curing device,
   an electron beam sterilization device,
   an electron beam disinfection device,
   a plasma generation device,
   an atomic element generation device,
   a spin-polarized electron beam generation device,
   a cathodoluminescence device, or
   an inverse photoemission spectroscopy device.
(8) An emission axis verification method for an electron beam emitted from a photocathode in a device including
   a light source,
   a photocathode configured to emit an electron beam in response to receiving light from the light source,
   an anode,
   an intermediate electrode arranged between the photocathode and the anode,
   an electron beam shielding member configured to block a part of an electron beam,
   a measurement unit configured to measure an intensity of an electron beam blocked by the electron beam shielding member, and
   an electron beam emission direction deflector arranged between the anode and the electron beam shielding member and configured to change a position where an electron beam reaches the electron beam shielding member, the emission axis verification method comprising:
   a first electron beam emission step of emitting an electron beam in a first state by irradiating the photocathode with excitation light when electric fields between the cathode and the intermediate electrode and between the intermediate electrode and the anode are in a first state;
   a first electron beam intensity change measurement step of measuring a change in intensity of a first electron beam blocked by the electron beam shielding member while changing a position of the first electron beam reaching the electron beam shielding member by using the electron beam emission direction deflector;
   a second electron beam emission step of emitting an electron beam in a second state by irradiating the photocathode with excitation light when electric fields between the cathode and the intermediate electrode and between the intermediate electrode and the anode are in a second state;

a second electron beam intensity change measurement step of measuring a change in intensity of a second electron beam blocked by the electron beam shielding member while changing a position of the second electron beam reaching the electron beam shielding member by using the electron beam emission direction deflector; and a misalignment verification step of verifying whether or not an electron beam emitted from the photocathode is misaligned from a designed center axis by comparing a measurement result of the first electron beam intensity change measurement step with a measurement result of the second electron beam intensity change measurement step.

(9) The emission axis verification method according to (8) above, wherein a change between the first state of the electric fields between the cathode and the intermediate electrode and between the intermediate electrode and the anode and the second state of the electric fields between the cathode and the intermediate electrode and between the intermediate electrode and the anode is performed by a change of a value of voltage applied to the intermediate electrode.

(10) The emission axis verification method according to (8) above, wherein a change between the first state of the electric fields between the cathode and the intermediate electrode and between the intermediate electrode and the anode and the second state of the electric fields between the cathode and the intermediate electrode and between the intermediate electrode and the anode is performed by a change of a position of the intermediate electrode between the cathode and the anode.

(11) An emission axis alignment method for an electron beam emitted from a photocathode, the emission axis alignment method comprising:

a light source position adjustment step and/or a photocathode position adjustment step performed after the misalignment verification step of the emission axis verification method according to any one of (8) to (10) above.

Advantageous Effect

According to the disclosure of the present application, it is possible to verify whether or not there is misalignment between the designed emission center axis and the center axis of an electron beam actually emitted from a photocathode.

BRIEF DESCRIPTION OF THE DRAWINGS

FIG. 5A is a schematic sectional view of a cathode 3, an intermediate electrode 7, and an anode 4. FIG. 5B is a sectional view taken along X-X' of FIG. 5A. FIG. 5C is a sectional view taken along Y-Y' of FIG. 5A.

FIG. 6A is a schematic sectional view illustrating an overview of electric fields occurring between the cathode 3, the intermediate electrode 7, and the anode 4. FIG. 6B and FIG. 6C are diagrams illustrating movement of electrons affected by electric fields.

FIG. 7A and FIG. 7B are schematic sectional views illustrating an electron beam flying from the cathode 3 to the electron beam shielding member 5 in a first electron beam emission step and a second electron beam emission step, respectively.

FIG. 9A and FIG. 9B are diagrams illustrating an overview of a first electron beam intensity change measurement step (ST2) when the positional relationship of the members that make up the electron gun 1A is correct.

FIG. 10A and FIG. 10B are diagrams illustrating an overview of a second electron beam intensity change measurement step (ST4) when the positional relationship of the members that make up the electron gun 1A is correct.

FIG. 11A and FIG. 11B are diagrams illustrating an overview of the first electron beam intensity change measurement step (ST2) when the positional relationship of the members that make up the electron gun 1A is not correct.

FIG. 12A and FIG. 12B are diagrams illustrating an overview of the second electron beam intensity change measurement step (ST4) when the positional relationship of the members that make up the electron gun 1A is not correct.

FIG. 13 represents diagrams illustrating a modified example of the first embodiment of the electron gun 1A and a modified example of the first embodiment of an emission axis verification method for an electron gun.

FIG. 14 is a schematic sectional view of an electron gun 1B according to a second embodiment.

FIG. 15A is a flowchart of an axis alignment method according to the first embodiment. FIG. 15B is a flowchart of a modified example of the first embodiment of the axis alignment method.

DETAILED DESCRIPTION OF EMBODIMENTS

Figure 1:
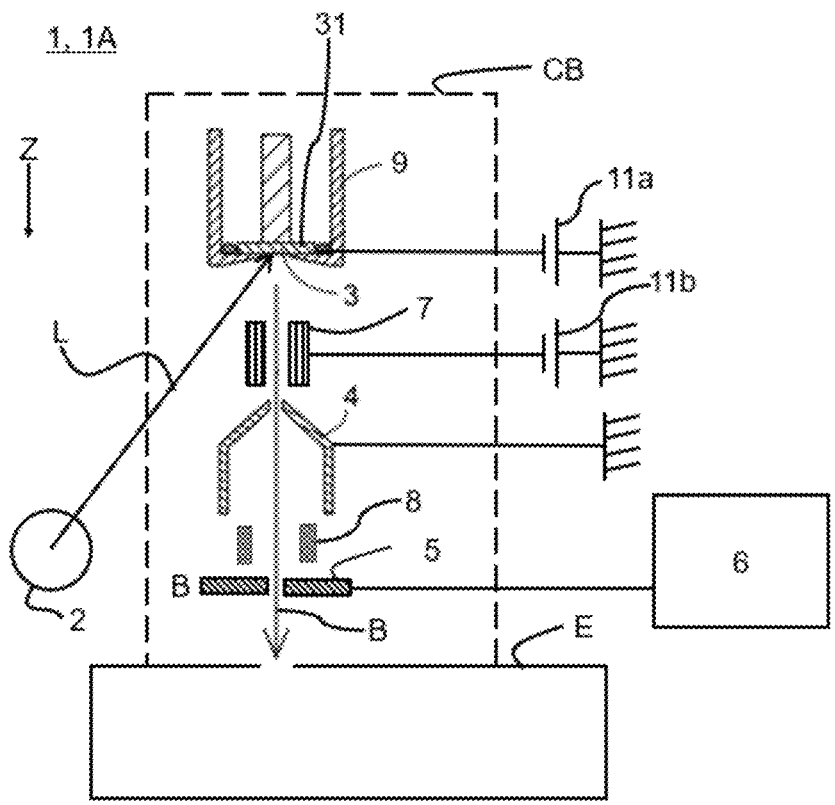
FIG. 1 is a schematic sectional view schematically illustrating an electron gun 1A of a first embodiment and a counterpart device E equipped with the electron gun 1A.

An electron gun, an electron beam applicator, an emission axis verification method for an electron beam emitted from a photocathode, and an emission axis alignment method for an electron beam emitted from a photocathode will be described below in detail with reference to the drawings. Note that, in the following embodiments, "emission axis verification method for an electron beam emitted from a photocathode" and "emission axis alignment method for an electron beam emitted from a photocathode" are described as "emission axis verification method for an electron gun" and "emission axis alignment method for an electron gun", respectively. Further, in the present specification, members having the same type of functions are labeled with the same or similar references. Further, duplicated description for the members labeled with the same or similar references may be omitted.

Further, the position, size, range, or the like of respective components illustrated in the drawings may be depicted differently from the actual position, size, range, or the like for easier understanding. Thus, the disclosure in the present application is not necessarily limited to the position, size, range, or the like disclosed in the drawings.

Definition of Direction

In the present specification, a direction in which an electron beam emitted from a photocathode travels toward an anode without being bent on the way is defined as a Z-axis direction. Note that, while the Z-axis direction is the perpendicularly downward direction, for example, the Z-axis direction is not limited to the perpendicularly downward direction. Further, a direction orthogonal to the Z-axis direction is defined as an X-axis direction, and a direction orthogonal to the Z-axis direction and the X-axis direction is defined as a Y-axis direction.

First Embodiment of Electron Gun 1A

Figure 2:
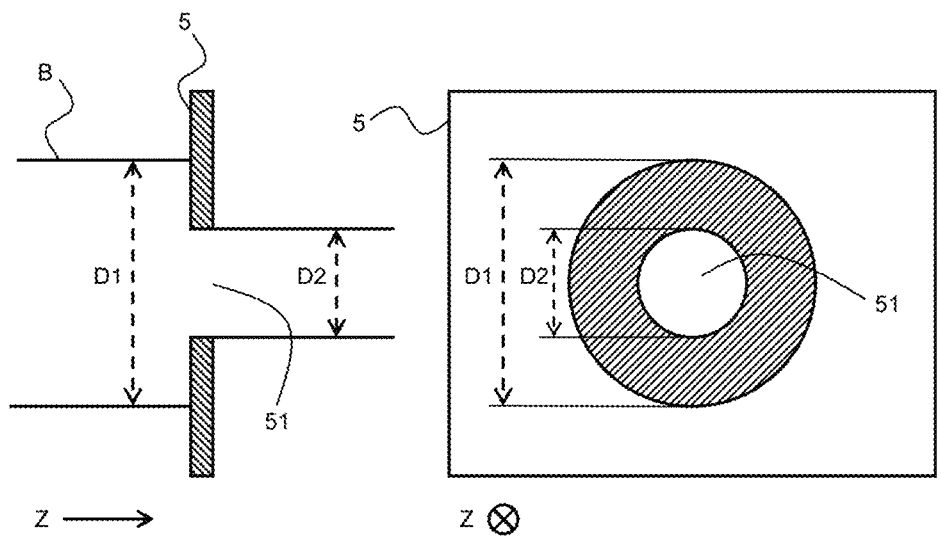
FIG. 2 is a diagram illustrating an electron beam shielding member 5 when viewed from a direction perpendicular to a Z-axis direction and the electron beam shielding member 5 when viewed from the Z-axis direction in the electron gun 1A of the first embodiment.

An electron gun 1A in the first embodiment will be described with reference to FIG. 1 and FIG. 2. FIG. 1 is a schematic sectional view schematically illustrating the electron gun 1A of the first embodiment and a counterpart device E equipped with the electron gun 1A. FIG. 2 is a diagram illustrating an electron beam shielding member 5 when viewed from a direction perpendicular to the Z-axis direction and the electron beam shielding member 5 when viewed from the Z-axis direction.

The electron gun 1A in the first embodiment includes at least a light source 2, a photocathode 3, an anode 4, the electron beam shielding member 5, a measurement unit 6, an intermediate electrode 7, and an electron beam emission direction deflector (hereafter, also referred to as a "deflector") 8. Optionally, additionally, the electron gun 1A may include a photocathode housing container 9 that houses the photocathode 3. Further, optionally, additionally, the electron gun 1A may include power supply devices 11a and 11b used for generating an electric field between the photocathode 3 and the intermediate electrode 7 and between the intermediate electrode 7 and the anode 4, respectively.

The light source 2 is not particularly limited as long as it can irradiate the photocathode 3 with excitation light L to cause the electron beam B to be emitted. The light source 2 may be, for example, a high power (watt order) and high frequency (several hundred MHz) ultrashort pulse laser light source, a relatively inexpensive laser diode, an LED, or the like. The emitted excitation light L may be any of pulse light or continuous light and may be controlled as appropriate in accordance with the purpose. Note that, in the example illustrated in FIG. 1, the light source 2 is arranged outside a vacuum chamber CB, and the excitation light L is emitted from the first surface (the surface on the anode 4 side) of the photocathode 3. Alternatively, when a photocathode substrate 31 described later is formed of a transparent material, the light source 2 may be arranged above the vacuum chamber CB, and the excitation light L may be emitted from the backside (the surface opposite to the first surface) of the photocathode 3. Further, the light source 2 may be arranged inside the vacuum chamber CB.

In the example illustrated in FIG. 1, the photocathode 3, the anode 4, the electron beam shielding member 5, the intermediate electrode 7, and the deflector 8 are arranged inside a vacuum chamber CB. The photocathode 3 emits an electron beam B in response to receiving excitation light L emitted from the light source 2. More specifically, electrons in the photocathode 3 are excited by the excitation light L, and excited electrons are emitted from the photocathode 3. The emitted electrons form the electron beam B in accordance with an electric field generated by the anode 4 and the cathode 3. Note that, with respect to usage of the terms "photocathode" and "cathode" in this specification, the term "photocathode" may be used when referring it as an emitter of an electron beam, and the term "cathode" may be used when referring it as a counter electrode of "anode", however, the reference "3" is used for both the cases of "photocathode" and "cathode".

The photocathode 3 is formed of a substrate 31 of quartz glass, sapphire glass, or the like and a photocathode film (not illustrated) adhered to the first surface (the surface on the anode 4 side) of the substrate 31. The photocathode material for forming the photocathode film is not particularly limited as long as it can emit an electron beam when irradiated with excitation light and may be made of a material requiring EA surface treatment, a material not requiring EA surface treatment, or the like. The material requiring EA surface treatment may be, for example, a group III-V semiconductor material or a group II-VI semiconductor material. Specifically, AlN, $Ce_2Te$, GaN, a compound of one or more types of alkali metals and Sb, AlAs, GaP, GaAs, GaSb, InAs, or the like, and a mixed crystal thereof, or the like may be used. Another example may be a metal, specifically, Mg, Cu, Nb, $LaB_6$, $SeB_6$, Ag, or the like. With EA surface treatment being performed on the photocathode material, the photocathode 3 can be fabricated, and for the photocathode 3, not only can excitation light be selected in the near-ultraviolet-infrared wavelength region in accordance with gap energy of a semiconductor but also desired electron beam source performance (quantum yield, durability, monochromaticity, time response, spin polarization) in accordance with a use of the electron beam can be obtained through selection of the material or the structure of the semiconductor.

Further, the material not requiring EA surface treatment may be, for example, a single metal, an alloy or a metal compound of Cu, Mg, Sm, Tb, Y, or the like or diamond, WBaO, $Cs_2Te$, or the like. The photocathode not requiring EA surface treatment can be fabricated by a known method (for example, see Japanese Patent No. 3537779). The contents disclosed in Japanese Patent No. 3537779 are incorporated in this specification by reference in their entirety.

The anode 4 is not particularly limited as long as it can generate an electric field with the cathode 3, and an anode commonly used in the field of electron guns can be used.

The arrangement of the power supply device is not particularly limited as long as the electron beam B can be emitted from the cathode 3 to the anode 4 through the intermediate electrode 7. In the example illustrated in FIG. 1, the power supply devices 11a and 11b are arranged such that potential differences are generated between the cathode and the intermediate electrode 7 and between the intermediate electrode 7 and the anode 4, and thereby electric fields can be generated.

The electron beam shielding member 5 has a hole 51 through which a part of the electron beam B emitted from the photocathode 3 passes.

In the first embodiment, the width of the hole 51 is smaller than the width of the electron beam B. As illustrated in FIG. 2 as an example, when the width of the electron beam B when reaching the electron beam shielding member 5 is denoted as D1 and the width of the hole 51 is denoted as D2, a portion of the electron beam B overlapping the hole 51 passes through the electron beam shielding member 5. On the other hand, a different portion of the electron beam B not passing through the hole 51 is blocked by the electron beam shielding member 5. A part of the electron beam B blocked by the electron beam shielding member 5 is then used as a "measurement electron beam", and the intensity thereof is measured by the measurement unit 6.

Alternatively, the width of the electron beam B may be smaller than the hole 51. The electron gun 1 disclosed in the present application uses the deflector 8 to deflect the emission direction of an electron beam. Therefore, even when the width of the electron beam B is smaller than the hole 51, a measurement electron beam blocked by the electron beam shielding member 5 can be obtained. The sizes of D1 and D2 can be suitably set taking into consideration of not only the use for verifying the emission axis of the electron gun 1A but also the operation efficiency of the electron gun 1A or the like.

The material of the electron beam shielding member 5 is not particularly limited as long as it is a conductor or a semiconductor. For example, in the case of a conductor, a metal such as stainless steel (SUS), copper, or the like may be used.

The measurement unit 6 measures the intensity of the measurement electron beam that is a part of the electron beam B blocked by the electron beam shielding member 5. The measurement unit 6 is not particularly limited as long as it can measure the intensity of the measurement electron beam. For example, when the electron beam shielding member 5 is a conductor, current occurs between the electron beam shielding member 5 and the measurement unit 6 due to the measurement electron beam. Thus, the intensity of the electron beam B can be measured as a value of current by the measurement unit 6. Note that the value of current can be measured by using a known ammeter though depiction thereof is omitted. Further, a measured value of current depends on the amount of the electron beam B blocked by the electron beam shielding member 5. Further, the value of current occurring when the measurement electron beam hits the semiconductor can be measured by using a semiconductor as the electron beam shielding member 5.

The measurement unit 6 may measure the intensity of the measurement electron beam by fluorescent intensity instead of a value of current. More specifically, a conductor on which a fluorescent material has been applied in advance may be used as the electron beam shielding member 5, and the fluorescent intensity of light emitted when the measurement electron beam hits the fluorescent material may be measured by the measurement unit 6. Note that a fluorescent intensity can be measured by using a known fluorometer.

The intermediate electrode 7 has an electron beam passage hole through which the electron beam B emitted from the photocathode 3 passes, and in the electron beam passage hole, a drift space is formed where effect of an electric field can be disregarded when the electric field is generated between the photocathode 3 and the anode 4 by application of a voltage. The material used for fabricating the intermediate electrode 7 is not particularly limited as long as it is a conductor and may be a metal such as stainless steel (SUS) or the like. Note that the structure of the intermediate electrode 7 is well known as disclosed in Japanese Patent No. 6466020. In Japanese Patent No. 6466020, however, the intermediate electrode 7 is used for adjusting a focal distance of the electron beam B. In contrast, in the electron gun 1A according to the first embodiment, the purpose of use of the intermediate electrode 7 differs in that, when used in combination with the electron beam shielding member 5, the measurement unit 6, and the deflector 8, the intermediate electrode 7 can also be used for verifying as to whether or not the electron beam B emitted from the photocathode 3 is misaligned from the designed emission center axis, as described later. Obviously, the intermediate electrode 7 may be used for adjustment of the focal distance of the electron beam B along with the verification of misalignment of the electron beam B. The content disclosed in Japanese Patent No. 6466020 is incorporated in the present specification by reference in its entirety.

The deflector 8 is not particularly limited as long as it can change, in the X-axis direction and the Y-axis direction, the position where the electron beam B that has passed through the anode 4 reaches the electron beam shielding member 5. Examples of the deflector 8 may be a magnetic field type deflection coil in which two pairs of coils orthogonal to each other are formed as a set and the axis alignment can be made by two-dimensional deflection, an electrostatic type beam deflector, or the like. Note that, as the deflector, the electrostatic type is the more preferable, because influence of noise is smaller and the device is simpler.

First Embodiment of Emission Axis Verification Method for Electron Gun

An overview of the first embodiment of an emission axis verification method for an electron gun (hereafter, also simply referred to as a "verification method") will be described with reference to FIG. 1 to FIG. 12.

First, the reason why a verification method according to the first embodiment is necessary will be described with reference to FIG. 3. FIG. 3A is a diagram illustrating an overview of an electron beam emitted when the positional relationship of members that make up the electron gun 1A is correct, and FIG. 3B is a diagram illustrating an overview of an electron beam emitted when the positional relationship of members that make up the electron gun 1A is not correct. Note that, in FIG. 3A and FIG. 3B, depiction of some features of the electron gun 1A is omitted for simplified illustration.

The electron gun 1A emits an electron beam when a portion irradiated with the excitation light L from the light source 2 of the photocathode (photocathode film) 3 is excited. In assembly of the electron gun 1A, a designed irradiation position 3c of the photocathode 3 to be irradiated with the excitation light L is determined so that an electron beam emitted from the photocathode 3 is emitted in the Z-axis direction toward the center of the anode 4. The light source 2 is then positioned so that the excitation light L from the light source 2 is emitted to the designed irradiation position 3c of the photocathode 3. As illustrated in FIG. 3A, when the excitation light L is correctly emitted to the designed irradiation position 3c, the emitted electron beam is emitted in the Z-axis direction from the photocathode 3 to the center of the anode 4, namely, straight toward the anode 4 without being bent on the way. Note that, in the present specification, the center axis of an electron beam when the designed irradiation position 3c of the photocathode 3 is irradiated with the excitation light L and an emitted electron beam is emitted straight toward the anode 4 without being bent on the way is defined as a designed emission center axis Bc.

Figures 3A, 3B:
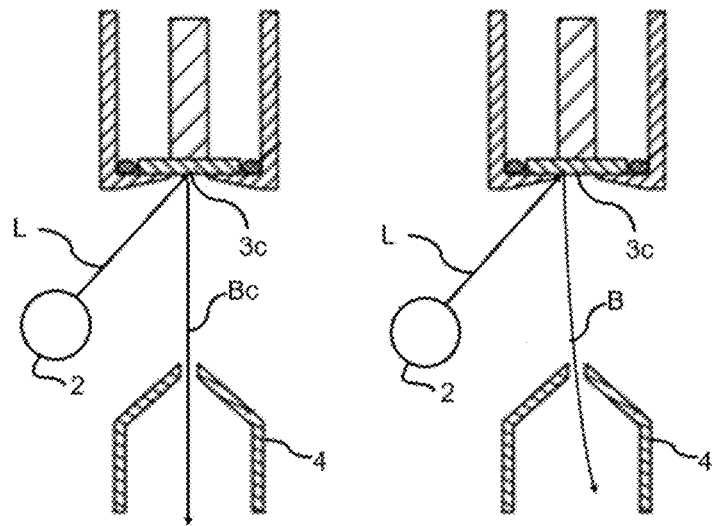
FIG. 3A is a diagram illustrating an overview of an electron beam emitted when the positional relationship of members that make up the electron gun 1A is correct.
FIG. 3B is a diagram illustrating an overview of an electron beam emitted when the positional relationship of members that make up the electron gun 1A is not correct.

In contrast, as illustrated in FIG. 3B, when the excitation light L is emitted to a position off the designed irradiation position 3c due to, for example,
(1) temporal change of members that make up the electron gun 1A,
(2) displacement occurring when the photocathode 3 is returned to the original place after the photocathode 3 is moved for EA surface treatment or heating cleaning of the photocathode 3 and the treatment is completed, or
(3) misalignment of a component due to a mechanical shock or the like,
the electron beam emitted from the photocathode 3 will be bent due to effect of the electric field of the cathode 3 and the anode 4. Thus, after the electron gun 1A is mounted to a counterpart device, it will be difficult to align the electron beam to the optical axis of the counterpart device. The verification method according to the first embodiment is a method for verifying whether or not the electron beam B emitted from the photocathode 3 is misaligned from the designed emission center axis Bc.

Figure 4:
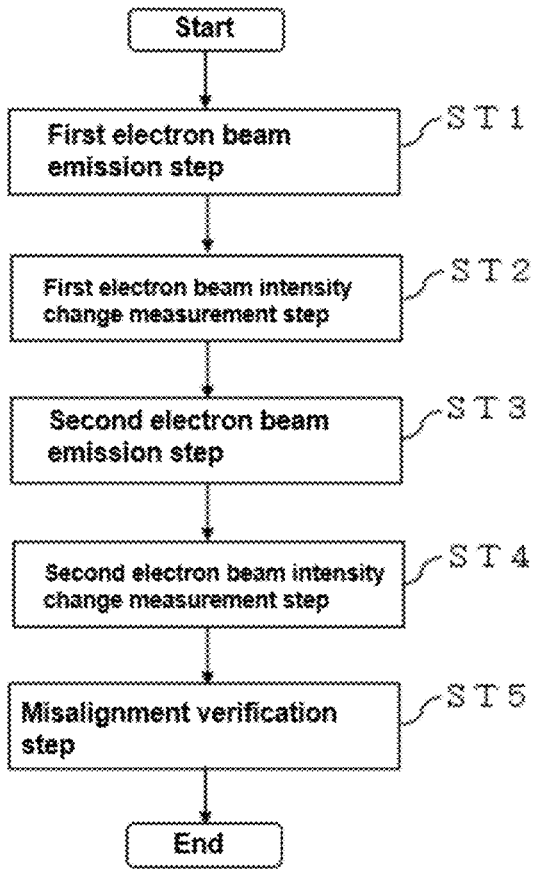
FIG. 4 is a flowchart of the first embodiment of a verification method.

Next, each step of the first embodiment of the verification method will be described with reference to FIG. 1 and FIG. 4. FIG. 4 is a flowchart of the first embodiment of the verification method. Note that the principle that makes it possible to verify whether or not there is misalignment between the emitted electron beam B and the designed emission center axis Bc according to the first embodiment of the verification method will be described later.

In the first step (ST1), a first electron beam emission step is performed. In the first electron beam emission step (ST1), as illustrated in FIG. 1, the excitation light L is emitted from the light source 2 to the photocathode 3, and the electron beam B is emitted from the photocathode 3. In this process, electric fields of a first state are generated between the cathode 3 and the intermediate electrode 7 and between the intermediate electrode 7 and the anode 4. Thus, the electron beam B emitted from the photocathode 3 passes through the intermediate electrode 7 and the anode 4 and reaches the electron beam shielding member 5. Note that, in the present specification, an electron beam when emitted in the first state of electric fields between the cathode 3 and the intermediate electrode 7 and between the intermediate electrode 7 and the anode 4 is defined as a "first electron beam B1".

In the second step (ST2), a first electron beam intensity change measurement step is performed. In the first electron beam intensity change measurement step (ST2), the intensity of a measurement electron beam blocked by the electron beam shielding member 5 of the first electron beam B1 is measured by the measurement unit 6. In this process, the position of the first electron beam B1 reaching the electron beam shielding member 5 is changed in the X-axis direction and the Y-axis direction by the deflector 8 illustrated in FIG. 1. Therefore, in accordance with the amount of deflection of the first electron beam B1 caused by the deflector 8, the intensity measured by the measurement unit 6 changes.

In the third step (ST3), a second electron beam emission step is performed. The second electron beam emission step (ST3) is the same as the first electron beam emission step (ST1) except for being performed in a second state of the electric fields between the cathode 3 and the intermediate electrode 7 and between the intermediate electrode 7 and the anode 4 generated in the first electron beam emission step (ST1). Thus, duplicated description will be omitted. Note that, in the present specification, an electron beam when emitted in the second state of electric fields between the cathode 3 and the intermediate electrode 7 and between the intermediate electrode 7 and the anode 4 is defined as a "second electron beam B2".

In the fourth step (ST4), a second electron beam intensity change measurement step (ST4) is performed. The second electron beam intensity change measurement step (ST4) is the same as the first electron beam intensity change measurement step (ST2) except that the electron beam reaching the electron beam shielding member 5 is the second electron beam B2. Thus, duplicated description will be omitted.

In the fifth step (ST5), a misalignment verification step (ST5) is performed. In the misalignment verification step (ST5), it is verified whether or not the electron beam emitted from the photocathode 3 is misaligned from the designed emission center axis Bc by comparing the measurement result of the first electron beam intensity change measurement step (ST2) with the measurement result of the second electron beam intensity change measurement step (ST4).

The principle that makes it possible to verify whether or not the electron beam B emitted from the photocathode 3 is misaligned from the designed emission center axis Bc in accordance with the first embodiment of the verification method will be described with reference to FIG. 5A to FIG. 12B.

Overview of Intermediate Electrode 7

Figure 5A:
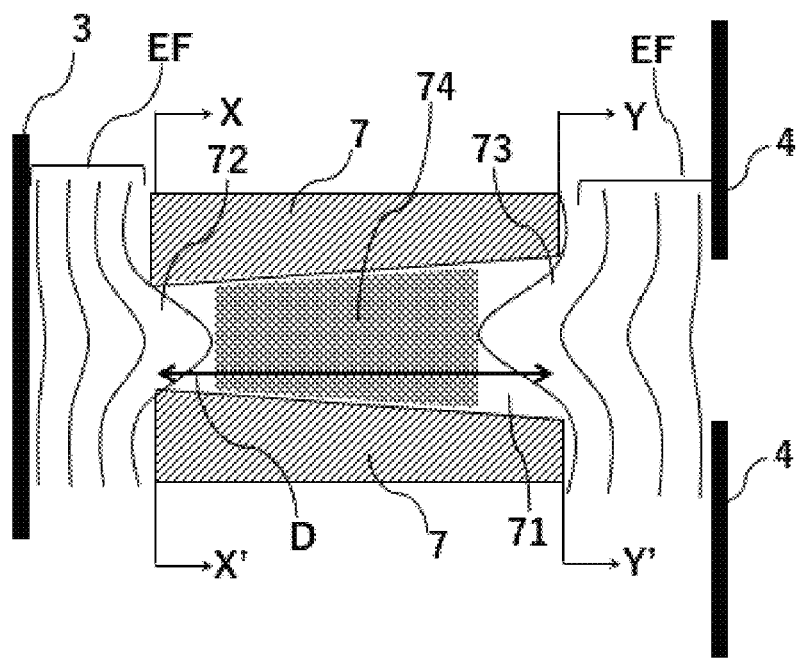
FIGS. 5A-5C represent diagrams illustrating the principle of the first embodiment of the verification method.
Figure 5B:
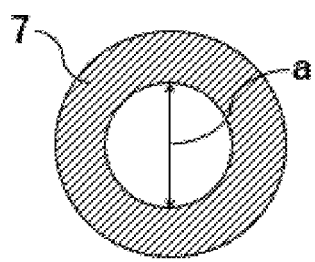
Figure 5C:
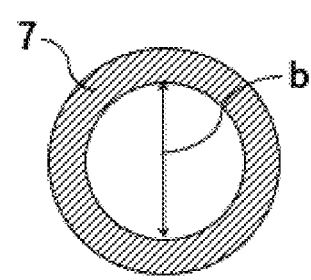

First, the overview of the intermediate electrode 7 will be described with reference to FIGS. 5A-5C. FIG. 5A is a schematic sectional view of the cathode 3, the intermediate electrode 7, and the anode 4, FIG. 5B is a sectional view taken along a line X-X' of FIG. 5A, and FIG. 5C is a sectional view taken along a line Y-Y' of FIG. 5A. In the example illustrated in FIGS. 5A-5C, the intermediate electrode 7 is formed of a hollow cylinder. An electron beam passage hole 71 through which an electron beam emitted from the photocathode 3 passes is formed in the intermediate electrode 7, an electron beam input port 72 is formed on the photocathode 3 side of the electron beam passage hole 71, and an electron beam exit port 73 is formed on the anode 4 side of the electron beam passage hole 71. A voltage is applied to generate a potential difference between the cathode 3 and the anode 4 and also applied to the intermediate electrode 7, and thereby, an electric field EF is generated between the cathode 3 and the intermediate electrode 7 and between the intermediate electrode 7 and the anode 4, as illustrated in FIG. 5A.

The range that the generated electric field EF strongly affects the movement of an electron beam in a gap is inside a sphere including a circle as the maximum cross section when the opening of the gap is the circle. In other words, when the diameter of the electron beam input port 72 illustrated in FIG. 5B is defined as "a", the inside of a sphere having the center at the center of the electron beam input port 72 of the electron beam passage hole 71 and having a radius of a/2 will be strongly affected by the generated electric field EF. Similarly, when the diameter of the electron beam exit port 73 illustrated in FIG. 5C is defined as "b", the inside of a sphere having the center at the center of the electron beam exit port 73 of the electron beam passage hole 71 and having a radius of b/2 will be affected by the generated electric field EF. Therefore, when the length in the center axis direction of the electron beam passage hole 71 is defined as D, when D/(a/2+b/2) is larger than 1, a drift space 74 not affected by the electric field EF is formed inside the electron beam passage hole 71. Note that, in the present specification, the "center axis direction" means a direction connecting the center of an electron beam input port 72 to the center of an electron beam output port 73. Further, the "center axis direction" coincide with the "designed emission center axis".

As described above, when D/(a/2+b/2) is larger than 1, a drift space 74 is formed. The value D/(a/2+b/2) is not particularly limited as long as it is larger than 1. However, to increase the range of misalignment between the center axes of the first electron beam B1 and the second electron beam B2 when reaching the electron beam shielding member 5, it is preferable that the drift space 74 have some extent of length, and the value may be suitably set to 1.5 or larger, 2 or larger, 3 or larger, 4 or larger, 5 or larger, or the like, for example. On the other hand, as long as the electron beam emitted from the photocathode 3 is within a range that can pass through the electron beam passage hole 71, there is no particular upper limit for D/(a/2+b/2). However, when D/(a/2+b/2) is larger, in other words, when the length D of the electron beam passage hole 71 is excessively longer, there is a problem of an increase in size of the electron gun 1A. Therefore, D/(a/2+b/2) is preferably 1000 or less in terms of device design, and can be suitably set to 500 or less, 100 or less, 50 or less, or the like, when necessary.

Note that, although the intermediate electrode 7 has a hollow cylindrical shape and the electron beam passage hole 71 is cone-shaped in the example illustrated in FIGS. 5A-5C, the shape of the intermediate electrode 7 is not particularly limited as long as it has the electron beam passage hole 71 and the drift space 74 is formed therein. For example, the cross section of the electron beam passage hole 71 may be polygonal, and in such a case, the "a" and "b" can be the diameters of the circumscribed circles of the polygon. In such a case, a line connecting the centers of the circumscribed circles can be defined as the "center axis direction". Further, when the cross section of the electron beam passage hole 71 is elliptical, the "a" and "b" can be the longer axes of the ellipse. In such a case, a line connecting the middle points of the longer axes can be defined as the "center axis direction". Further, although the electron beam input port 72 is smaller than the exit port 73, in other words, a relationship of a<b is met in the example illustrated in FIGS. 5A-5C, the "a" and "b" may have a relationship of a=b or a>b. Further, although the line connecting the electron beam input port 72 and exit port 73 is a straight line in sectional view in the example illustrated in FIG. 5A, the line may be a non-straight line in sectional view. For example, the length of the cross section in the center part of the electron beam passage hole 71 (cross section of a portion forming a drift space) may be longer than "a" and "b" to have substantially a barrel-shaped electron beam passage hole 71. Note that, while the width of an electron beam increases inside the drift space 74, it is preferable that the electron beam having the increased width do not collide with the wall surface of the electron beam passage hole. Thus, the size of the cross section of the electron beam passage hole 71 can be suitably determined by calculating the degree to increase the width of an electron beam based on the adjustment range of the focal point.

While the intermediate electrode 7 can be arranged anywhere between the cathode 3 and the anode 4, when the arrangement position of the intermediate electrode 7 is excessively close to the cathode 3 or the anode 4, in other words, exceeds the discharge limit, no electron beam will be released. Therefore, the intermediate electrode 7 can be arranged so that the distance between the cathode 3 and the anode 4 does not exceeds the discharge limit.

Further, although the intermediate electrode 7 is formed as a single member in the example illustrated in FIGS. 5A-5C, a divided structure of a plurality of combined members may be employed as long as the electric field EF generated between the cathode 3 and the anode 4 does not enter the electron beam passage hole 71 from a part other than the electron beam input port 72 and exit port 73.

Figure 6A:
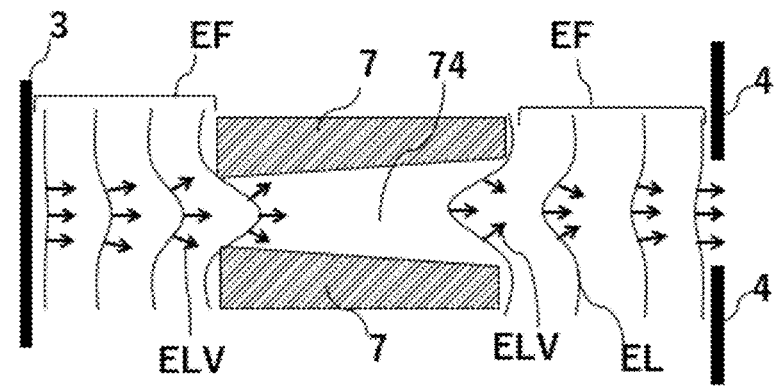
FIGS. 6A-6C represent diagrams illustrating the principle of the first embodiment of the verification method.
Figure 6B:
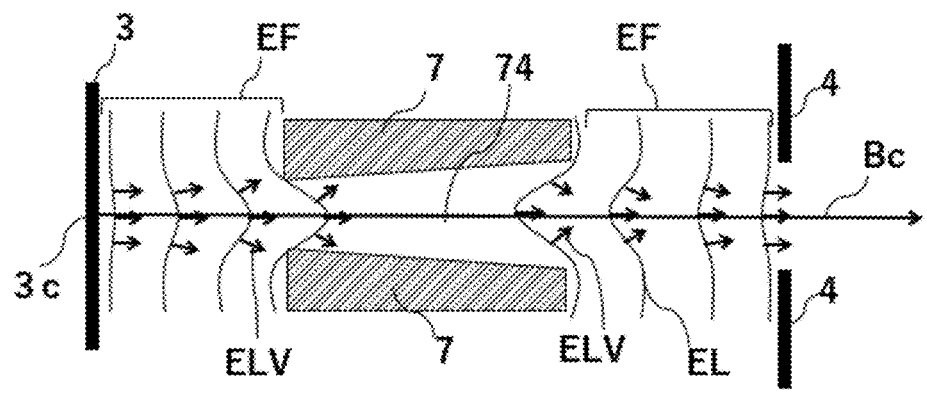
Figure 6C:
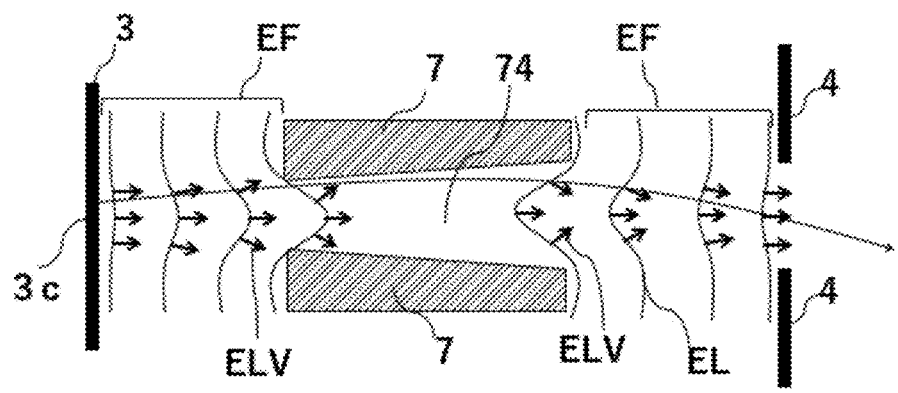
Figure 7A:
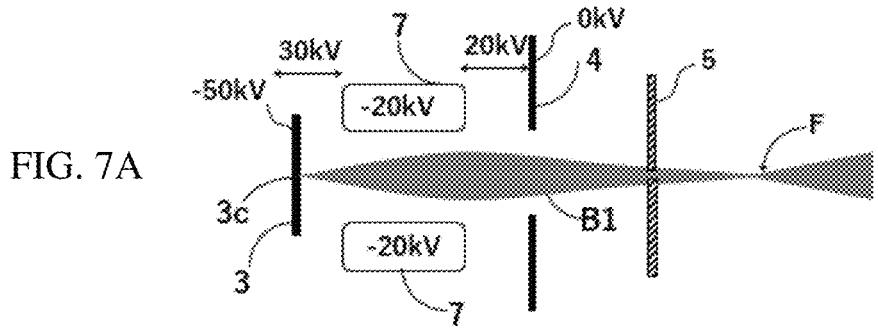
FIGS. 7A-7B represent diagrams illustrating the principle of the first embodiment of the verification method.
Figure 7B:
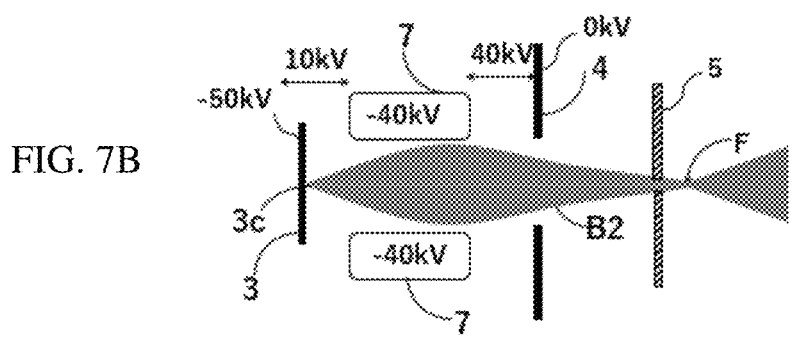

Next, movement of an electron (electron beam) when the intermediate electrode 7 having the drift space 74 is provided between the cathode 3 and the anode 4 will be described with reference to FIGS. 6A-6C and FIGS. 7A-7B. FIG. 6A is a schematic diagram illustrating the movement of an electron subjected to effect of an electric field generated between the cathode 3, the intermediate electrode 7, and the anode 4. FIG. 6B and FIG. 6C are diagrams illustrating movement of electrons affected by electric fields. FIG. 7A and FIG. 7B are schematic sectional views illustrating an electron beam flying from the cathode 3 to the electron beam shielding member 5 in a first electron beam emission step and a second electron beam emission step, respectively.

It is known that, when passing through an electric field (EF), an electron beam (electron) is subjected to force from the electric field based on the following principle.

Principle 1: An outer part of an electron beam with respect to the center axis thereof is subjected to stronger force.

Principle 2: An electron beam crossing more equipotential lines per unit length is subjected to stronger force.

Principle 3: An electron beam having larger energy in the traveling direction when crossing an equipotential line is subjected to smaller force in the orthogonal direction (orthogonal to the traveling direction).

More specifically, as illustrated in FIG. 6A, the electric field EF is generated between the cathode 3 and the intermediate electrode 7 and between the intermediate electrode 7 and the anode 4 due to potential differences. At this time, equipotential lines EL are generated in the electric field EF, and a normal direction force ELV is generated to each equipotential line EL. That is, an electron beam (electron) is subjected to effect of the normal direction force ELV.

FIG. 6B illustrates movement of electrons when the positional relationship of the members that make up the electron gun 1A is correct and the designed irradiation position 3c of the photocathode 3 is irradiated with excitation light. Note that, although an electron beam has a spread, the example illustrated in FIG. 6B illustrates only the movement of electrons at the center of an emitted electron beam for illustrative purposes. The same applies to FIG. 6C described later. As illustrated in FIG. 6B, an electron beam emitted from the designed irradiation position 3c in response to the designed irradiation position 3c of the photocathode 3 being correctly irradiated with excitation light is not subjected to normal direction force ELV. Therefore, when the positional relationship of the members that make up the electron gun 1A is correct, electrons at the center of the electron beam B emitted from the photocathode 3 are subjected to only traveling force in the center axis direction. The axis on which electrons at the center of the electron beam move at this time is the designed emission center axis Bc.

On the other hand, FIG. 6C illustrates movement of electrons when the positional relationship of the members that make up the electron gun 1A is misaligned and the designed irradiation position 3c of the photocathode 3 is not irradiated with excitation light. As illustrated in FIG. 6C, when a position off the designed irradiation position 3c of the photocathode 3 is irradiated with excitation light, an electron beam emitted from the photocathode 3 is subjected to the normal direction force ELV. Therefore, when the positional relationship of the members that make up the electron gun 1A is not correct, electrons at the center of the electron beam B emitted from the photocathode 3 are subjected to the normal direction force ELV and misaligned from the center axis direction.

Next, differences between the first electron beam emission step and the second electron beam emission step will be described with reference to FIGS. 7A-7B. FIG. 7A is a schematic sectional view illustrating movement of an electron beam of the first electron beam emission step when the positional relationship of the members that make up the electron gun 1A is correct, and FIG. 7B is a schematic sectional view illustrating movement of an electron beam of the second electron beam emission step when the positional relationship of the members that make up the electron gun 1A is correct. In the examples illustrated in FIG. 7A and FIG. 7B, the voltage applied to the intermediate electrode 7 is changed to implement a method of changing the electric field between the cathode 3 and the intermediate electrode 7 and between the intermediate electrode 7 and the anode 4 from the first state to the second state. In the example illustrated in FIG. 7A and FIG. 7B, the difference between the voltage applied to the cathode 3 (−50 kV) and the voltage applied to the anode 4 (0 kV) is constant, and the value of the voltage applied to the intermediate electrode 7 is changed between the first condition (FIG. 7A, −20 kV) and the second condition (FIG. 7B, −30 kV). The voltage difference between the cathode 3 and the intermediate electrode 7 is 30 kV in FIG. 7A and 20 kV in FIG. 7B. That is, when the voltage applied to the intermediate electrode 7 is a value closer to the voltage of the cathode 3, the potential difference between the cathode 3 and the intermediate electrode 7 is smaller. Further, the smaller the potential difference is, the smaller the density of equipotential lines between the cathode 3 and the intermediate electrode 7 is, and therefore, for an electron beam emitted from the photocathode 3, the second electron beam B2 illustrated in FIG. 7B is more likely to diverge than the first electron beam B1 illustrated in FIG. 7A. Furthermore, since a drift space is formed in the intermediate electrode 7, the first electron beam B1 and the second electron beam B2 that are likely to diverge further diverge in the drift space.

On the other hand, since the potential difference between the cathode 3 and the anode 4 is constant, the potential difference between the intermediate electrode 7 and the anode 4 will change opposite to the potential difference between the cathode 3 and the intermediate electrode 7. That is, since the potential difference between the intermediate electrode 7 and the anode 4 is larger in FIG. 7B than in FIG. 7A, the density of equipotential lines between the intermediate electrode 7 and the anode 4 is also larger in FIG. 7B than in FIG. 7A. Furthermore, since the width of the electron beam after exiting the drift space is larger in FIG. 7B than in FIG. 7A, for an electron beam that has exited the intermediate electrode 7, the second electron beam B2 illustrated in FIG. 7B is more likely to be converged than the first electron beam B1 of FIG. 7A. That is, when the potential difference between the intermediate electrode 7 and the anode 4 is larger, the focal point F can be moved to the short focal point side. Thus, the size is different between the first electron beam B1 and the second electron beam B2 when reaching the electron beam shielding member 5, and the amount of the measurement electron beam blocked by the electron beam shielding member 5 is also different therebetween. As illustrated in FIG. 6B, however, when the positional relationship of the members that make up the electron gun 1A is correct, electrons at the center of the electron beam are not subjected to normal direction force. Thus, the centers of the first electron beam B1 and the second electron beam B2 passing through the electron beam shielding member 5 coincide with each other.

In contrast, a case where the first electron beam emission step and the second electron beam emission step are performed in the state illustrated in FIG. 6C will be described. As illustrated in FIG. 6C, when an electron beam is emitted from a place off the designed irradiation position 3c of the photocathode 3, electrons at the center of the electron beam are subjected to the normal direction force ELV. Further, as illustrated in FIG. 7A and FIG. 7B, the electric fields between the cathode 3 and the intermediate electrode 7 and between the intermediate electrode 7 and the anode 4 in the first electron beam emission step are different from those of the second electron beam emission step. Therefore, the normal direction force ELV applied to electrons at the center of the electron beam is different between the first electron beam emission step and the second electron beam emission step. Therefore, in the electron beam of the embodiment illustrated in FIG. 6C, the centers of the first electron beam B1 and the second electron beam B2 when reaching the electron beam shielding member 5 do not coincide.

Next, the first electron beam intensity change measurement step (ST2), the second electron beam intensity change measurement step (ST4), and the misalignment verification step (ST5) will be described with reference to FIG. 8 to FIG. 12B.

Figure 8:
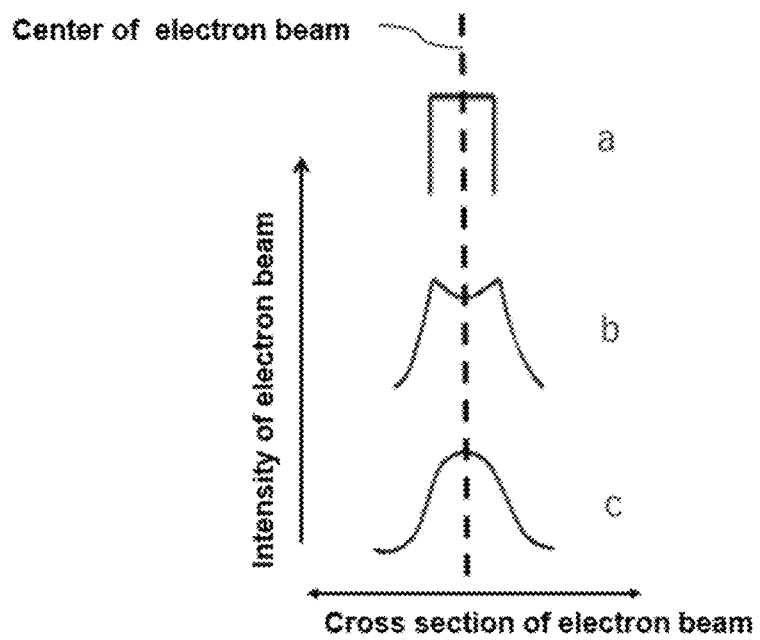
FIG. 8 is a diagram illustrating the principle of the first embodiment of the verification method, which is a diagram illustrating a cross section of an electron beam and an intensity distribution of an electron beam.

First, FIG. 8 is a diagram illustrating a cross section of an electron beam and an intensity distribution of an electron beam. As illustrated in FIG. 8, in accordance with the emission condition of an electron beam or the like, there are cases where:

a. the intensity of an electron beam is the same at any positions inside the irradiation region of the electron beam,
b. the intensity is lower in the peripheral part of the irradiation region, and
c. the intensity is lower in the peripheral part of the irradiation region.

All the cases illustrated in a to c, however, the electron beam intensity distribution is substantially the same between the left and the right with respect to the center of the cross section of the electron beam.

Figure 9A:
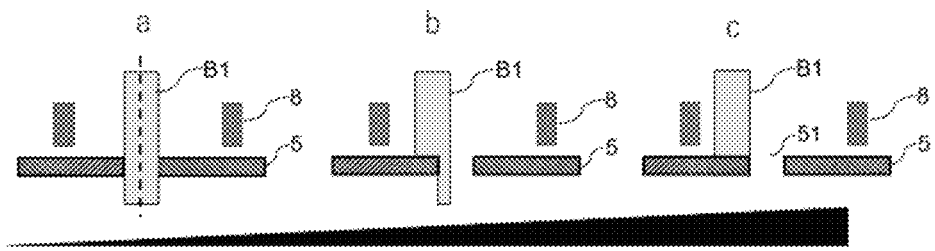
FIGS. 9A-9B represent diagrams illustrating the principle of the first embodiment of the verification method.
Figure 9B:
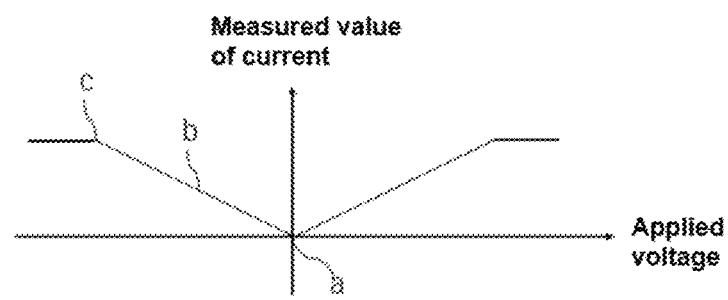
Figure 10A:
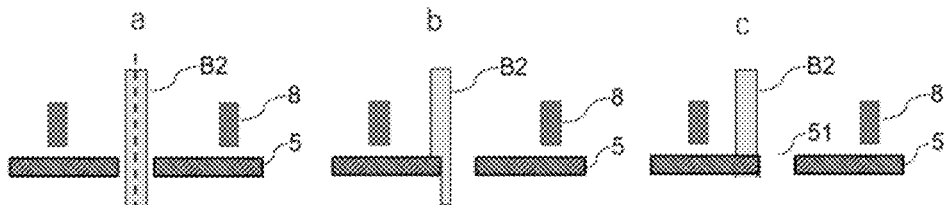
FIGS. 10A-10B represent diagrams illustrating the principle of the first embodiment of the verification method.
Figure 10B:
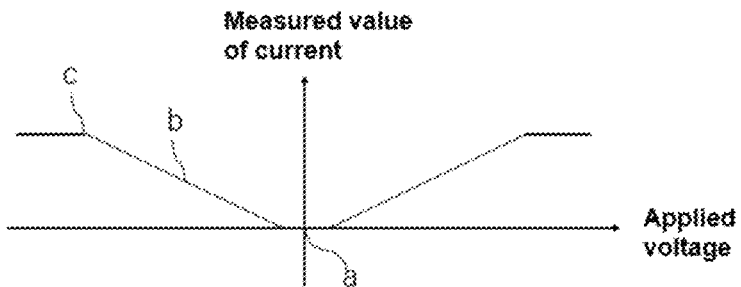

FIG. 9A and FIG. 9B are diagrams illustrating an overview of the first electron beam intensity change measurement step (ST2) when the positional relationship of the members that make up the electron gun 1A is correct. FIG. 10A and FIG. 10B are diagrams illustrating an overview of the second electron beam intensity change measurement step (ST4) when the positional relationship of the members that make up the electron gun 1A is correct. Note that FIG. 9A and FIG. 9B are diagrams when it is assumed that the size (width) of the first electron beam B1 when reaching the electron beam shielding member 5 and the size (width) of the hole 51 of the electron beam shielding member 5 are the same. As illustrated in FIG. 9A, an increased positive or negative voltage applied to the deflector 8 results in a larger amount of deflection of the first electron beam B1. Therefore, in a state where there is no part of the first electron beam B1 blocked by the electron beam shielding member 5 as illustrated in "a" of FIG. 9, the value of current measured by the measurement unit is 0. On the other hand, an increased voltage applied to the deflector 8 results in a larger amount of deflection of the first electron beam B1, as illustrated in "b" and "c" of FIG. 9A. As a result, as illustrated in FIG. 9B, an increased voltage applied to the deflector 8 results in a larger measured value of current. Then, after the whole first electron beam B1 is off the hole 51, the value of current measured by the measurement unit is constant. Further, also when the voltage applied to the deflector 8 is changed and the first electron beam B1 is deflected in a direction opposite to the example illustrated in "a" to "c", the electron beam intensity has a distribution that is substantially the same between the left and the right with respect to the center of the cross section of the electron beam, as illustrated in FIG. 8. Therefore, the measured value of current is substantially left-right symmetrical about the voltage 0 applied to the deflector 8, as illustrated in FIG. 9B.

Next, the overview of the second electron beam intensity change measurement step (ST4) will be described with reference to FIG. 10A and FIG. 10B. Note that FIG. 10A and FIG. 10B illustrate an example when it is assumed that the size (width) of the second electron beam B2 when reaching the electron beam shielding member 5 is smaller than the size (width) of the hole 51 of the electron beam shielding member 5. The second electron beam intensity change measurement step (ST4) is the same as the first electron beam intensity change measurement step (ST2) except that the electron beam reaching the electron beam shielding member 5 is the second electron beam B2 having a different area from the first electron beam B1. Further, in the example illustrated in FIG. 10A, since the second electron beam B2 is smaller than the hole of the electron beam shielding member 5, the measured value of current is 0 until a predetermined level of voltage is applied to the deflector 8. Further, while the second electron beam B2 reaching the electron beam shielding member 5 has a smaller size than the first electron beam B1, the second electron beam B2 emitted from the photocathode 3 has the same intensity as the first electron beam B1. Therefore, the slope of the graph (measured value of current/applied voltage) is larger than the slope in the first electron beam intensity change measurement step (ST2).

As illustrated in FIG. 9B and FIG. 10B, however, when the positional relationship of the members that make up the electron gun 1A is correct, the graph is substantially left-right symmetrical about the voltage of 0 applied to the deflector 8.

Note that, in FIGS. 9A-9B and FIGS. 10A-10B, illustration has been provided assuming that the sizes (widths) of the first electron beam B1 and the second electron beam B2 when reaching the electron beam shielding member 5 are less than or equal to the size (width) of the hole 51 of the shield member for illustrative purposes. On the other hand, when the sizes (widths) of the first electron beam B1 and the second electron beam B2 when reaching the electron beam shielding member 5 are larger than the size (width) of the hole 51 of the shield member, the measured value of current is not 0 even when the voltage applied to the deflector 8 is 0. However, although the graph shapes differ, it is apparent from the above illustration of FIGS. 9A-9B and FIGS. 10A-10B that the measurement result of measured values of current is left-right symmetrical about the voltage of 0 applied to the deflector 8.

Figure 11A:
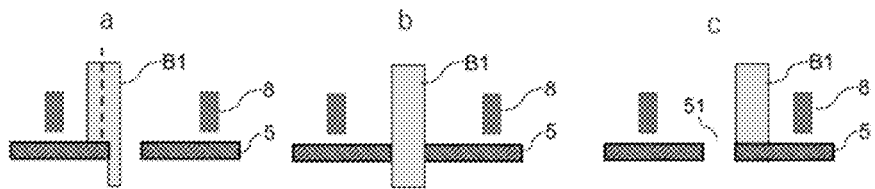
FIGS. 11A-11B represent diagrams illustrating the principle of the first embodiment of the verification method.
Figure 11B:
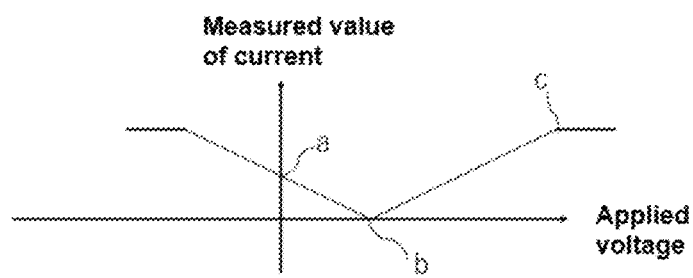

Next, the overview of the first electron beam intensity change measurement step (ST2) when the positional relationship of the members that make up the electron gun 1A is not correct will be described with reference to FIG. 11A and FIG. 11B. Note that FIG. 11A and FIG. 11B illustrate an example when it is assumed that the size (width) of the first electron beam B1 when reaching the electron beam shielding member 5 and the size (width) of the hole 51 of the electron beam shielding member 5 are the same. In the example illustrated in FIGS. 11A-11B, unlike the example illustrated in FIGS. 9A-9B, the center of the first electron beam B1 (dotted line) when reaching the electron beam shielding member 5 is off the center of the hole 51. Therefore, when the level of the positive or negative voltage applied to the deflector 8 is changed to deflect the first electron beam B1, the value of voltage applied to the deflector 8 when the measured value of current is the smallest is not 0.

Figure 12A:
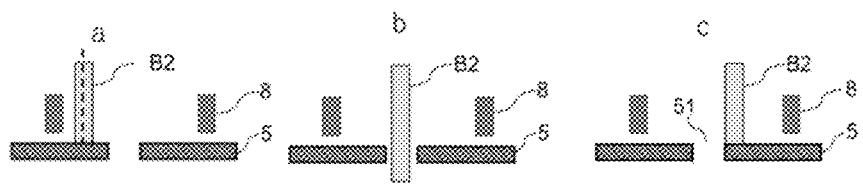
FIGS. 12A-12B represent diagrams illustrating the principle of the first embodiment of the verification method.
Figure 12B:
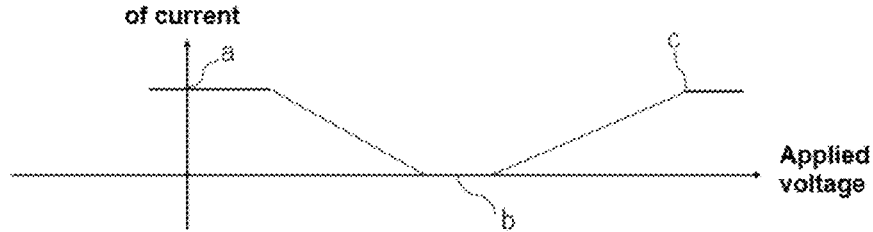

Next, the overview of the second electron beam intensity change measurement step (ST4) when the positional relationship of the members that make up the electron gun 1A is not correct will be described with reference to FIG. 12A and FIG. 12B. Note that FIG. 12A and FIG. 12B illustrate an example when it is assumed that the size (width) of the second electron beam B2 when reaching the electron beam shielding member 5 is smaller than the size (width) of the hole 51 of the electron beam shielding member 5. As illustrated in FIGS. 6A-6C and FIGS. 7A-7B, when the designed irradiation position 3c of the photocathode 3 is not irradiated with excitation light, the centers of the first electron beam B1 and the second electron beam B2 when reaching the electron beam shielding member 5 do not coincide. Thus, as illustrated in FIG. 12A and FIG. 12B, when the level of the positive or negative voltage applied to the deflector 8 is changed to deflect the second electron beam B2, the value of voltage applied to the deflector 8 when the measured value of current is the smallest (when the measured value of current of 0 continues, the median of a range of voltage values where the measured value of current is 0) differs from the value of voltage of the first electron beam B1 illustrated in FIG. 11B.

As described above, in the first electron beam intensity change measurement step (ST2) and the second electron beam intensity change measurement step (ST4), the measured value of current and the voltage applied to the deflector 8 are plotted in a graph or the like to find a correlation between the value of current measured by the measurement unit and the voltage applied to the deflector 8. Then, in the first electron beam intensity change measurement step (ST2) and the second electron beam intensity change measurement step (ST4), while the voltages of the deflector 8 resulting in the left-right symmetrical graph are the same when the positional relationship of the members that make up the electron gun 1A is correct, the values of voltage of the deflector 8 resulting in the left-right symmetrical graph are different from each other when the positional relationship of the members that make up the electron gun 1A is not correct. Therefore, in the misalignment verification step (ST5), by comparing the measurement results of the first electron beam intensity change measurement step (ST2) and the second electron beam intensity change measurement step (ST4) with each other, it is possible to confirm that the positional relationship of the members that make up the electron gun 1A is correct when the voltages of the deflector 8 where the graph is left-right symmetrical are the same, and it is possible to confirm that the positional relationship of the members that make up the electron gun 1A is misaligned from the correct state when the values of voltage are different.

Note that, for easier understanding, the above description has been provided assuming that, when the positional relationship of the members that make up the electron gun 1A is correct, the voltages of the deflector 8 resulting in left-right symmetrical graph are the same (0). Alternatively, the values of voltage of the deflector 8 resulting in left-right symmetrical graphs measured in the first electron beam intensity change measurement step (ST2) and the second electron beam intensity change measurement step (ST4) may not be 0 in a strict sense and may be different from each other as long as these values of voltage are within design tolerance. The degree of misalignment considered within the tolerance can be suitably adjusted in a design process.

Further, although FIG. 9A to FIG. 12B illustrate the examples in which the deflection is performed in either one of the X-axis and the Y-axis by using the deflector 8, it is apparent that the deflection can be performed in both the two directions of the X-axis direction and the Y-axis direction in the first electron beam intensity change measurement step (ST2) and the second electron beam intensity change measurement step (ST4).

FIG. 1 and FIG. 9A to FIG. 12B illustrate the examples in which one set of the deflector 8 is used to deflect the first electron beam B1 and the second electron beam B2 in the X-axis direction and the Y-axis direction. Alternatively, two sets of the deflectors 8 may be arranged in the Z-axis direction between the anode 4 and the electron beam shielding member 5. When two sets of the deflectors 8 are arranged in the Z-axis direction, (1) after the deflector 8 on the anode 4 side (hereafter, also referred to as a "first deflector 8a") is used to deflect the first electron beam B1 and the second electron beam B2 in the X-axis direction and the Y-axis direction, (2) the deflector 8 on the electron beam shielding member 5 side (hereafter, also referred to as a "second deflector 8b") is used to re-deflect the first electron beam B1 and the second electron beam B2, which are inclined (or further inclined) from the Z-axis direction by the deflection using the first deflector 8a, in a direction substantially parallel to the Z-axis direction, and thereby, (3) the first electron beam B1 and the second electron beam B2 can be emitted to the electron beam shielding member 5 from substantially the perpendicular direction.

An increased voltage applied to the deflector 8 results in a larger amount of deflection of the first electron beam B1 and the second electron beam B2. Therefore, the inclination from the designed emission center axis Bc of the first electron beam B1 and the second electron beam B2 when reaching the electron beam shielding member 5, namely, the irradiation angle relative to the electron beam shielding member 5 more deviates from the perpendicular direction as the voltage applied to the deflector 8 increases. Thus, the irradiation conditions of the first electron beam B1 and the second electron beam B2 when reaching the electron beam shielding member 5 will change in accordance with the voltage applied to the deflector 8.

Since the electron gun 1A is assembled while the positional relationship of the component members is being verified, the electron beam B emitted from the photocathode 3 is not significantly misaligned from the designed emission center axis Bc. Thus, even when one set of the deflector 8 is used to deflect the first electron beam B1 and the second electron beam B2, the verification method according to the first embodiment can be performed, because the irradiation conditions of the first electron beam B1 and the second electron beam B2 when reaching the electron beam shielding member 5 do not significantly change.

On the other hand, when two sets of the deflector 8a and the deflector 8b are used, the first electron beam B1 and the second electron beam B2 can be emitted to the electron beam shielding member 5 from substantially the perpendicular direction. In other words, regardless of the voltage applied to the deflector 8, the irradiation conditions of the first electron beam B1 and the second electron beam B2 when reaching the electron beam shielding member 5 can be the same. Therefore, the use of two sets of the deflector 8a and the deflector 8b can further increase the accuracy of the verification method.

Modified Example of First Embodiment of Electron Gun 1A and Modified Example of First Embodiment of Emission Axis Verification Method for Electron Gun In the first embodiment of the electron gun 1A and the first embodiment of the emission axis verification method for the electron gun (hereafter, also simply referred to as "the first embodiment"), the first state and the second state are implemented by changing the voltage applied to the intermediate electrode 7 with respect to the electric fields between the cathode 3 and the intermediate electrode 7 and between the intermediate electrode 7 and the anode 4. A modified example of the first embodiment (hereafter, also simply referred to as "the modified example") differs from the first embodiment in that the first state and the second state are changed by employing a drive unit (method) that moves the position of the intermediate electrode 7 arranged between the photocathode 3 and the anode 4 in the designed emission center axis direction of an electron beam, and other features are the same. Accordingly, in the modified example, features different from the first embodiment will be mainly described, and duplicated description for the features that have already been described in the first embodiment will be omitted. It is thus apparent that, even when not explicitly described in the modified example, the feature that has already been described in the first embodiment can be employed in the modified example.

The modified example will be more specifically described with reference to FIG. 13. The example illustrated in FIG. 13 has a constant voltage difference between the cathode 3 and the anode 4 and the value of voltage applied to the intermediate electrode 7 and includes a drive unit 12 that drives the intermediate electrode 7 in the center axis direction (the designed emission center axis direction) of the electron beam passage hole 71 between the cathode 3 and the anode 4. Although, in the example illustrated in FIG. 13, the example in which a motor 12a is fixed to the intermediate electrode 7 and the intermediate electrode 7 is driven by rack-and-pinion structure that engages a pinion fixed to the shaft of the motor 12a into the rack 12b is illustrated, the drive unit 12 is not particularly limited as long as it can drive the intermediate electrode 7 in the center axis direction.

In the example illustrated in FIG. 13, when the position of the intermediate electrode 7 is changed between the cathode 3 and the anode 4, this causes a change in the distance between the cathode 3 and the intermediate electrode 7 and the distance between the intermediate electrode 7 and the anode 4. On the other hand, because the potential difference between the cathode 3 and the anode 4 and the voltage applied to the intermediate electrode 7 are constant, when the position of the intermediate electrode 7 is changed, this causes a change in the density of equipotential lines between the cathode 3 and the intermediate electrode 7 and the density of equipotential lines between the intermediate electrode 7 and the anode 4. More specifically, while the potential difference between the cathode 3 and the intermediate electrode 7 is the same, the density of equipotential lines between the cathode 3 and the intermediate electrode 7 is smaller in the order from FIG. 13A to FIG. 13C. Furthermore, since a drift space is formed in the intermediate electrode 7, the electron beam B that is likely to spread further spreads in the drift space.

On the other hand, the density of equipotential lines between the intermediate electrode 7 and the anode 4 is opposite to that between the cathode 3 and the intermediate electrode 7. That is, the density of equipotential lines between the intermediate electrode 7 and the anode 4 is larger in the order from FIG. 13A to FIG. 13C. Furthermore, since the width of the electron beam that has exited the drift space is larger in the order from FIG. 13A to FIG. 13C, the electron beam B that has exited the intermediate electrode 7 is more likely to be converged in the order from FIG. 13A to FIG. 13C. That is, a shorter distance between the intermediate electrode 7 and the anode 4 enables the focal position to be on the shorter focal point side. Therefore, when the designed irradiation position 3c of the photocathode 3 is not irradiated with excitation light, the centers of the first electron beam B1 and the second electron beam B2 when reaching the electron beam shielding member 5 do not coincide in the same manner as described with FIGS. 6A-6C and FIGS. 7A-7B.

As described above, also in the modified example, the first state and the second state can be adjusted with respect to the electric fields between the cathode 3 and the intermediate electrode 7 and between the intermediate electrode 7 and the anode 4.

The electron gun 1A and the verification method according to the first embodiment and the modified example achieve an advantageous effect that it is possible to verify whether or not there is misalignment of the designed emission center axis due to a temporal change of a member that make up the electron gun 1A, mechanical shock, or the like.

Second Embodiment of Electron Gun 1 and Emission Axis Alignment Method for Electron Gun A second embodiment of the electron gun 1 will be described with reference to FIG. 14. FIG. 14 is a schematic sectional view of an electron gun 1B according to the second embodiment. The electron gun 1B is the same as the electron gun 1A according to the first embodiment except that the electron gun 1B includes a light source position adjustment member 21 used for adjusting the position of excitation light. Thus, in the second embodiment, the light source position adjustment member 21 will be mainly described, and duplicated description for the features that have already been described in the first embodiment will be omitted.

As described above, with the first embodiment and the modified example, it is possible to verify whether or not the electron beam B emitted from the electron gun 1A is misaligned from the designed emission center axis Bc. Therefore, the first embodiment and the modified example can be used for an emission axis alignment method performed at the initial setting when the electron gun 1 is mounted to the counterpart device E.

As illustrated in FIGS. 11A-11B and FIGS. 12A-12B, it is possible to verify a change in the value of current measured by the measurement unit 6 in accordance with the voltage applied to the deflector 8. Further, before the verification method is performed, the followings are determined in advance:

(1) the values of voltage applied to the cathode 3, the intermediate electrode 7, and the anode 4,
(2) the distance between the cathode 3 and the intermediate electrode 7 and the distance between the intermediate electrode 7 and the anode 4, and
(3) the length of the drift space of the intermediate electrode 7. Thus, when the electron beam shielding member 5 is viewed from above in the Z-axis direction, it is possible to calculate the degree that the electron beam B1 (B2) is misaligned from the center of the hole 51 in the X-axis direction and the Y-axis direction, namely, the mount of misalignment from the designed emission center axis.

The electron gun 1B according to the second embodiment includes the light source position adjustment member 21. Thus, the light source position adjustment member 21 is driven based on the above calculation, and thereby the excitation light L emitted from the light source 2 can be adjusted to irradiate the designed irradiation position 3c of the photocathode 3.

The light source position adjustment member 21 is not particularly limited as long as it can adjust excitation light emitted from the light source 2 in the X-axis direction and the Y-axis direction. For example, the light source 2 can be attached to a known XY-axis stage, and the position of the light source 2 can be changed. Alternatively, although depiction is omitted, a reflection mirror may be arranged between the light source 2 and the photocathode 3 to deflect the emission direction of the excitation light L. Note that, although the excitation light L from the light source 2 is arranged at a position to irradiate the first face of the photocathode 3 in the example illustrated in FIG. 14, the light source 2 and the light source position adjustment member 21 may be arranged above the vacuum chamber CB, and the excitation light L may irradiate the backside of the photocathode 3.

The electron gun 1B according to the second embodiment can be used in an emission axis alignment method for the electron gun (hereafter, also referred to as "axis alignment method"). FIG. 15A illustrates a flowchart of the axis alignment method according to the first embodiment. In the axis alignment method, a light source position adjustment step (ST6) is performed after the verification method is performed. The light source position adjustment step (ST6) can adjust the position of excitation light emitted from the light source 2 by using the light source position adjustment member 21 based on the amount of misalignment of the electron beam from the designed emission center axis found by the calculation described above.

FIG. 15B is a flowchart of a modified example of the first embodiment of the axis alignment method. As illustrated in FIG. 15B, after performing the light source position adjustment step (ST6), the process may return to the first electron beam emission step (ST1), repeat ST6 to ST1 when it is determined that there is misalignment in the misalignment verification step (ST5) (Yes), and repeat each step until it is determined that there is no misalignment in the misalignment verification step (ST5) (No).

Figure 16:
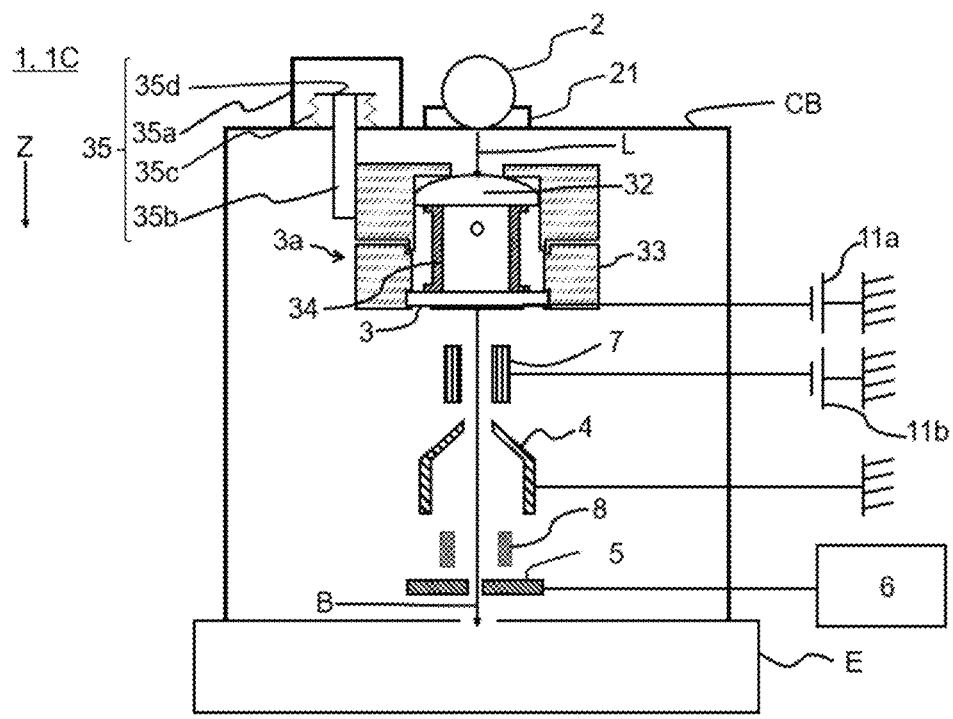
FIG. 16 is a schematic sectional view of an electron gun 1C according to a third embodiment.

Third Embodiment of Electron Gun 1 and Second Embodiment of Emission Axis Alignment Method for Electron Gun The third embodiment of the electron gun 1 will be described with reference to FIG. 16. FIG. 16 is a schematic sectional view of an electron gun 1C according to the third embodiment. The electron gun 1C illustrated in FIG. 16 is the same as the electron gun 1B according to the second embodiment except that the electron gun 1C includes a photocathode kit 3a and a photocathode position adjustment member 35 that adjusts the position of the photocathode 3 (the photocathode kit 3a). Thus, in the third embodiment, the photocathode kit 3a and the photocathode position adjustment member 35 will be mainly described, and duplicated description for the features that have already been described in the second embodiment will be omitted.

The photocathode kit 3a includes at least the photocathode 3 (photocathode film), a lens 32 for focusing the focal point on the photocathode film, and a holder 33 and is held by the holder 33 so that the distance between the photocathode 3 and the lens 32 is unchanged. In an example illustrated in FIG. 16, an example provided with a spacer 34 between the lens 32 and the photocathode 3 is illustrated. Note that the details of the photocathode kit 3a are disclosed in Japanese Patent Application No. 2019-150764. The content disclosed in Japanese Patent Application No. 2019-150764 is incorporated in the present specification by reference in its entirety.

In the example illustrated in FIG. 16, a lens used for focusing the focal point on the photocathode film is embedded in the photocathode kit 3a. Therefore, the light source 2 and the light source position adjustment member 21 are arranged above the vacuum chamber CB.

The photocathode position adjustment member 35 needs to adjust the position of the photocathode kit 3a, which is arranged inside the vacuum chamber CB (vacuum region), from outside of the vacuum chamber CB (vacuum region). It is thus desirable for the photocathode position adjustment member 35 to include an extra-chamber power transmission member 35a arranged outside the vacuum chamber CB (vacuum region) and an intra-chamber power transmission member 35b arranged inside the vacuum chamber CB (vacuum region). In the example illustrated in FIG. 16, an expansion and contraction member 35c such as bellows and a hole-less wall 35d are used to fix the end of the intra-chamber power transmission member 35b to the hole-less wall 35d. Thus, driving force can be transmitted from outside of the vacuum chamber CB (vacuum region) in a state where the intra-chamber power transmission member 35b is arranged inside the vacuum region made up of the vacuum chamber CB, the expansion and contraction member 35c, and the hole-less wall 35d. Note that the principle according to which driving force can be transmitted from outside of the vacuum chamber CB (vacuum region) to the intra-chamber power transmission member 35b arranged inside the vacuum chamber CB (vacuum region) is disclosed in International Publication No. 2018/186294. The content disclosed in International Publication No. 2018/186294 is incorporated in the present specification by reference in its entirety.

International Publication No. 2018/186294 discloses an example in which the intra-chamber power transmission member 35b mainly performs driving in the Z-axis direction. However, when the size of the hole at a position where the intra-chamber power transmission member 35b is inserted in the vacuum chamber CB is set to be larger than the intra-chamber power transmission member 35b, it is possible to move the intra-chamber power transmission member 35b in the X-axis direction and the Y-axis direction in addition to the Z-axis direction. As a result, the position of the photocathode 3 can be adjusted in both the X-axis direction and the Y-axis direction. The extra-chamber power transmission member 35a is not particularly limited as long as it can drive the hole-less wall 35d in the X-axis direction, the Y-axis direction, and the Z-axis direction, and a known XYZ stage may be used. Note that the example described above illustrates an example of the photocathode position adjustment member 35. The photocathode position adjustment member 35 is not limited to the above example as long as it can adjust the position of the photocathode 3 from outside of the vacuum chamber CB (vacuum region).

When the electron gun 1C according to the third embodiment is used, the light source position adjustment member 21 can be adjusted in accordance with the amount of misalignment from the designed emission center axis. Note that, unlike the electron gun 1A according to the first embodiment, the electron gun 1C according to the third embodiment is provided with the lens 32 such that the focal point is focused on the photocathode film. Thus, with adjustment of only the light source position adjustment member 21, the excitation light L may be unable to irradiate the designed irradiation position 3c. In such a case, adjustment can be performed together with the photocathode position adjustment member 35. Alternatively, it is also assumed that, although the position of the light source 2 is correct, the installation position of the photocathode kit 3a may be misaligned. In such a case, only the photocathode position adjustment member 35 may be used to adjust the position of the photocathode 3.

In the second embodiment of the emission axis alignment method for the electron gun, the light source position adjustment step (ST6) of the first embodiment of the emission axis alignment method for the electron gun can be replaced with a light source position adjustment step and/or a photocathode position adjustment step (ST6).

Fourth Embodiment of Electron Gun 1

Figure 17:
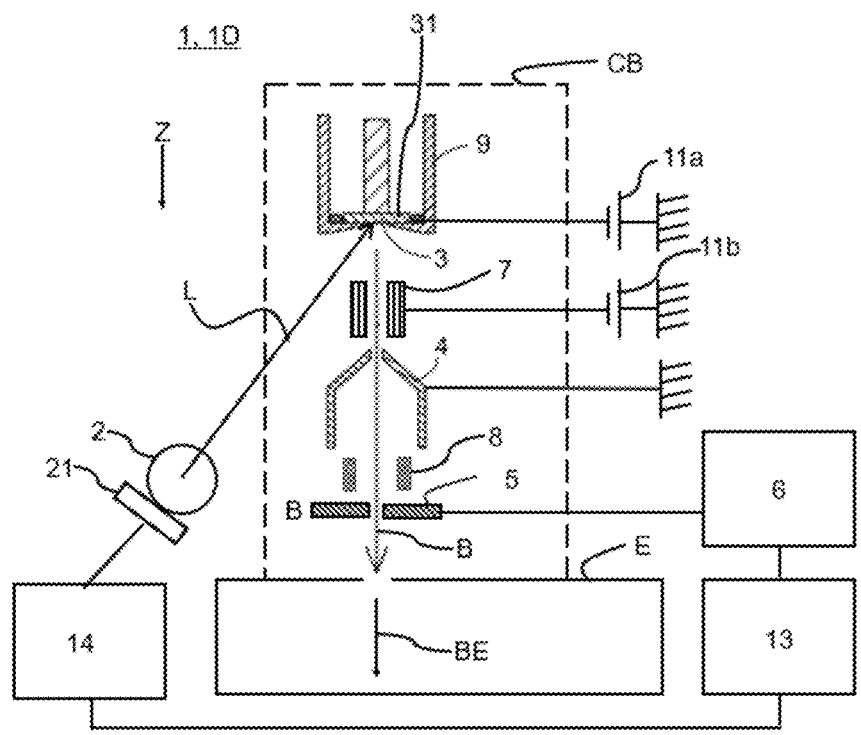
FIG. 17 is a schematic sectional view of an electron gun 1D according to a fourth embodiment.

The fourth embodiment of the electron gun 1 will be described with reference to FIG. 17. FIG. 17 is a schematic sectional view of an electron gun 1D according to the fourth embodiment. The electron gun 1D illustrated in FIG. 17 is the same as the electron gun 1B according to the second embodiment except that the electron gun 1D includes a calculation unit 13 and a control unit 14. Thus, in the fourth embodiment, the calculation unit 13 and the control unit 14 will be mainly described, and duplicated description for the features that have already been described in the second embodiment will be omitted.

The level of misalignment between the designed emission center axis for an electron beam and the electron beam B emitted from the photocathode 3 can be calculated manually. In the electron gun 1D according to the fourth embodiment, however, whether or not there is misalignment and the amount of misalignment are calculated by the calculation unit 13 based on the measurement value measured by the measurement unit 6. Further, the electron gun 1D includes the control unit 14 that drives and controls the light source position adjustment member 21 in accordance with the calculation result calculated by the calculation unit 13. Therefore, the use of the electron gun 1D according to the fourth embodiment achieves an advantageous effect that the misalignment verification step (ST5) and the light source position adjustment step (ST6) can be automated. Note that it is apparent that the electron gun 1D according to the fourth embodiment is applicable to the electron gun 1C according to the third embodiment. In such a case, the control unit 14 drives and controls the light source position adjustment member 21 and/or the photocathode position adjustment member 35.

Fifth Embodiment of Electron Gun 1

Figure 18:
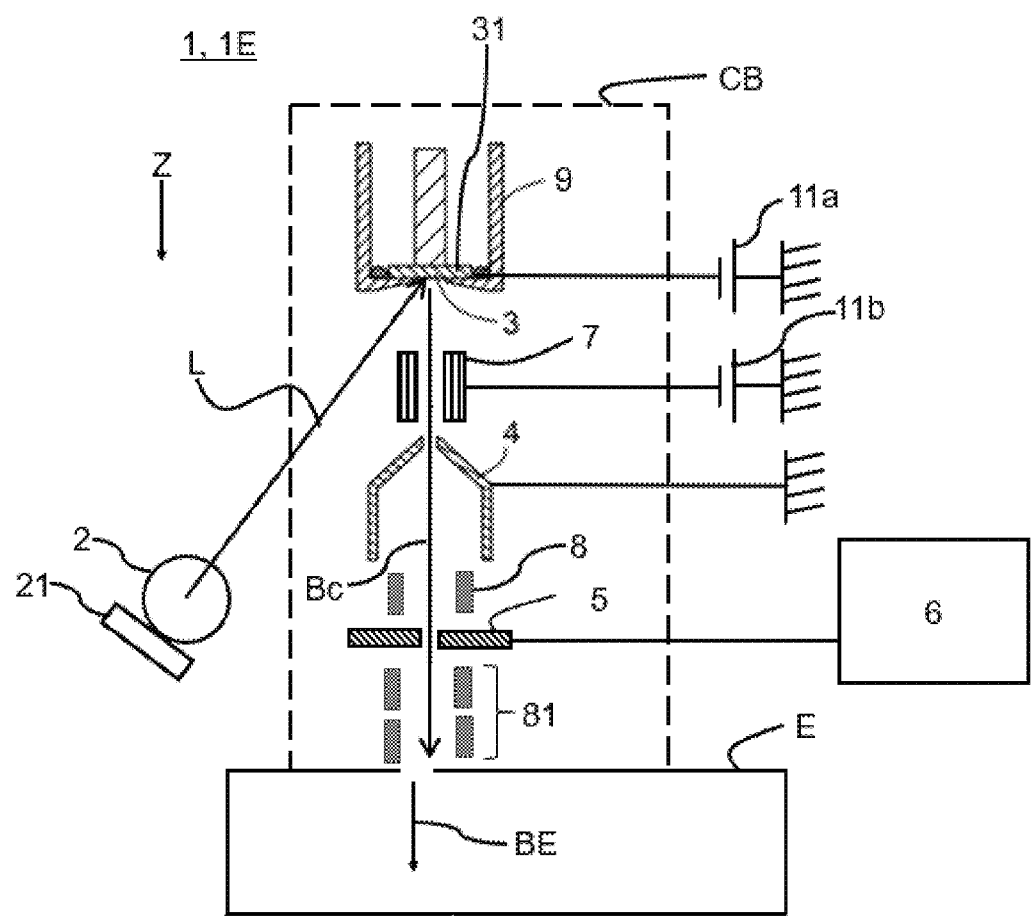
FIG. 18 is a schematic sectional view of an electron gun 1E according to a fifth embodiment.

The fifth embodiment of the electron gun 1 will be described with reference to FIG. 18. FIG. 18 is a schematic sectional view of an electron gun 1E according to the fifth embodiment. The electron gun 1E illustrated in FIG. 18 is the same as the electron gun 1B according to the second embodiment except that the electron gun 1E includes an electron beam deflector 81. Thus, in the fifth embodiment, the electron beam deflector 81 will be mainly described, and duplicated description for the features that have already been described in the second embodiment will be omitted.

According to the electron gun 1 of the second to fourth embodiments described above, the electron gun 1 can emit the electron beam B along the designed emission center axis Bc. After the electron gun 1 is mounted to the counterpart device E, however, misalignment may be found between the designed emission center axis Bc and the incident axis BE of the counterpart device E. In such a case, the amount of the electron beam B set by the counterpart device E will not be provided for incidence. Since the electron gun 1E according to the fifth embodiment includes the electron beam deflector 81 that deflects the electron beam B that has passed through the electron beam shielding member 5, it is possible to align the incident axis BE of the counterpart device E to which the electron gun 1E is mounted with the emission direction of the electron beam B emitted from the electron gun 1E.

Whether or not there is misalignment between the incident axis BE of the counterpart device E and the emission direction of the electron beam B emitted from the electron gun 1E can be detected in accordance with whether or not a predetermined amount of electron beam reaches an electron beam intensity detector such as a Faraday cup provided to the counterpart device E or the like. Further, a known device that can deflect an electron beam can be used for the electron beam deflector 81, and, for example, a device similar to the electron beam emission direction deflector 8 can be used. Note that, in the example illustrated in FIG. 18, the electron beam deflector 81 is one of the members of the electron gun 1E. Alternatively, the electron beam deflector 81 provided to the counterpart device E may be used to address misalignment between the incident axis BE of the counterpart device E and the emission direction of the electron beam B emitted from the electron gun 1E.

The electron beam applicator E to which an electron gun is mounted may be a known device to which an electron gun is mounted. The electron beam applicator E may be, for example, a free electron laser accelerator, an electron microscope, an electron holography device, an electron beam drawing device, an electron diffractometer, an electron beam inspection device, an electron beam metal additive manufacturing device, an electron beam lithography device, an electron beam processing device, an electron beam curing device, an electron beam sterilization device, an electron beam disinfection device, a plasma generation device, an atomic element generation device, a spin-polarized electron beam generation device, a cathodoluminescence device, an inverse photoemission spectroscopy device, or the like.

Note that, in the above embodiments of the verification method and the axis alignment method, all of the intermediate electrode 7, the electron beam shielding member 5, the measurement unit 6, and the deflector 8 are arranged in the electron gun 1, and thereby the embodiments have been described as the verification method and the axis alignment method for the electron gun 1. Alternatively, all of the members except for the intermediate electrode 7 or some of these members may not be provided to the electron gun 1. More specifically, all the members or some member(s) of the electron beam shielding member 5, the measurement unit 6, and the deflector 8 may be provided to the counterpart device E. Further, all the members or some member(s) of the electron beam shielding member 5, the measurement unit 6, and the deflector 8 may be provided as a kit separate from the electron gun 1 and the counterpart device E.

As described in the above embodiments of the verification method and the axis alignment method, the combined use of the intermediate electrode 7, the electron beam shielding member 5, the measurement unit 6, and the deflector 8 makes it possible to verify whether or not the electron beam B emitted from the photocathode 3 is misaligned from the designed emission center axis Bc. Therefore, when some or all of the electron beam shielding member 5, the measurement unit 6, and the deflector 8 are arranged in a part other than the electron gun 1, "emission axis verification method for an electron gun" and "emission axis alignment method for an electron gun" can be replaced with "emission axis verification method for an electron beam emitted from a photocathode" and "emission axis alignment method for an electron beam emitted from a photocathode", respectively.

INDUSTRIAL APPLICABILITY

The use of the electron gun, the electron beam applicator, the emission axis verification method for an electron beam emitted from a photocathode, and the emission axis alignment method for an electron beam emitted from a photocathode disclosed in the present application makes it possible to verify whether or not an electron beam is emitted along a designed emission center axis. Therefore, the electron gun, the electron beam applicator, the method of verifying an emission axis of an electron beam emitted from a photocathode, and the method of aligning an emission axis of an electron beam emitted from a photocathode disclosed in the present application are useful for business entities that handle an electron beam emitted from a photocathode of an electron gun or the like.

LIST OF REFERENCES 1, 1A to 1E electron gun
2 light source
21 light source position adjustment member
3 photocathode
31 substrate
32 lens
33 holder
34 spacer
45 photocathode position adjustment member
3a photocathode kit
3c designed irradiation position
35a extra-chamber power transmission member
35b intra-chamber power transmission member
35c expansion and contraction member
35d hole-less wall
4 anode
5 electron beam shielding member
51 hole
6 measurement unit
7 intermediate electrode
71 electron beam passage hole 72 electron beam input port
73 electron beam output port
74 drift space
8 electron beam emission direction deflector
81 electron beam deflector
9 photocathode housing container
11a, 11b power supply device
12 drive unit
12a motor
12b rack
13 calculation unit
14 control unit
B electron beam
B1 first electron beam
B2 second electron beam
Bc designed emission center axis
BE incident axis of counterpart device E
CB vacuum chamber
D1 width of an electron beam
D2 width of a hole
E counterpart device
EF electric field
EL equipotential line
ELV normal direction force to EL
F focal point
L excitation light

The invention claimed is:

1. An electron gun comprising:
a light source;
a photocathode configured to emit an electron beam in response to receiving light from the light source; and
an anode,
wherein the electron gun includes
an intermediate electrode arranged between the photocathode and the anode,
an electron beam shielding member configured to block a part of an electron beam,
a measurement unit configured to measure an intensity of an electron beam blocked by the electron beam shielding member, and
an electron beam emission direction deflector arranged between the anode and the electron beam shielding member and configured to change a position where an electron beam that passed through the anode reaches the electron beam shielding member, and
wherein the intermediate electrode has
an electron beam passage hole through which an electron beam emitted from the photocathode passes through, and
a drift space is formed in the electron beam passage hole such that, when an electric field is generated between the photocathode and the anode by application of a voltage, effect of the electric field can be disregarded.

2. The electron gun according to claim 1 further comprising: a light source position adjustment member configured to adjust a position of excitation light emitted to the photocathode; and/or a photocathode position adjustment member configured to adjust a position of the photocathode.

3. The electron gun according to claim 1 further comprising: a power supply device configured to change a value of voltage applied to the intermediate electrode; and/or a drive unit configured to adjust a position of the intermediate electrode, which is arranged between the photocathode and the anode, in a designed emission center axis direction of an electron beam.

4. The electron gun according to claim 1 further comprising a calculation unit configured to calculate a misalignment between a designed emission center axis of an electron beam and an electron beam emitted from the photocathode in accordance with a measurement result measured by the measurement unit.

5. The electron gun according to claim 4 further comprising a control unit configured to control a light source position adjustment member and/or a photocathode position adjustment member in accordance with a calculation result calculated by the calculation unit.

6. The electron gun according to claim 1 further comprising an electron beam deflector configured to deflect an electron beam that passed through the electron beam shielding member in order to align an incident axis of a counterpart device to which the electron gun is mounted with an emission direction of an electron beam emitted from the electron gun.

7. An electron beam applicator comprising the electron gun according to claim 1, wherein the electron beam applicator is:
a free electron laser accelerator,
an electron microscope,
an electron holography device,
an electron beam drawing device,
an electron diffractometer,
an electron beam inspection device,
an electron beam metal additive manufacturing device,
an electron beam lithography device,
an electron beam processing device,
an electron beam curing device,
an electron beam sterilization device,
an electron beam disinfection device,
a plasma generation device,
an atomic element generation device,
a spin-polarized electron beam generation device,
a cathodoluminescence device, or
an inverse photoemission spectroscopy device.

8. An emission axis verification method for an electron beam emitted from a photocathode in a device including
a light source,
a photocathode configured to emit an electron beam in response to receiving light from the light source,
an anode,
an intermediate electrode arranged between the photocathode and the anode,
an electron beam shielding member configured to block a part of an electron beam,
a measurement unit configured to measure an intensity of an electron beam blocked by the electron beam shielding member, and
an electron beam emission direction deflector arranged between the anode and the electron beam shielding member and configured to change a position where an electron beam reaches the electron beam shielding member, the emission axis verification method comprising:
a first electron beam emission step of emitting an electron beam in a first state by irradiating the photocathode with excitation light when electric fields between the cathode and the intermediate electrode and between the intermediate electrode and the anode are in a first state;
a first electron beam intensity change measurement step of measuring a change in intensity of a first electron beam blocked by the electron beam shielding member while changing a position of the first electron beam reaching the electron beam shielding member by using the electron beam emission direction deflector;

a second electron beam emission step of emitting an electron beam in a second state by irradiating the photocathode with excitation light when electric fields between the cathode and the intermediate electrode and between the intermediate electrode and the anode are in a second state;

a second electron beam intensity change measurement step of measuring a change in intensity of a second electron beam blocked by the electron beam shielding member while changing a position of the second electron beam reaching the electron beam shielding member by using the electron beam emission direction deflector; and a misalignment verification step of verifying whether or not an electron beam emitted from the photocathode is misaligned from a designed center axis by comparing a measurement result of the first electron beam intensity change measurement step with a measurement result of the second electron beam intensity change measurement step.

9. The emission axis verification method according to claim 8, wherein a change between the first state of the electric fields between the cathode and the intermediate electrode and between the intermediate electrode and the anode and the second state of the electric fields between the cathode and the intermediate electrode and between the intermediate electrode and the anode is performed by a change of a value of voltage applied to the intermediate electrode.

10. The emission axis verification method according to claim 8, wherein a change between the first state of the electric fields between the cathode and the intermediate electrode and between the intermediate electrode and the anode and the second state of the electric fields between the cathode and the intermediate electrode and between the intermediate electrode and the anode is performed by a change of a position of the intermediate electrode between the cathode and the anode.

11. An emission axis alignment method for an electron beam emitted from a photocathode, the emission axis alignment method comprising:

a light source position adjustment step and/or a photocathode position adjustment step performed after the misalignment verification step of the emission axis verification method according to claim 8.

12. The electron gun according to claim 2 further comprising: a power supply device configured to change a value of voltage applied to the intermediate electrode; and/or a drive unit configured to adjust a position of the intermediate electrode, which is arranged between the photocathode and the anode, in a designed emission center axis direction of an electron beam.

13. The electron gun according to claim 2 further comprising a calculation unit configured to calculate a misalignment between a designed emission center axis of an electron beam and an electron beam emitted from the photocathode in accordance with a measurement result measured by the measurement unit.

14. The electron gun according to claim 3 further comprising a calculation unit configured to calculate a misalignment between a designed emission center axis of an electron beam and an electron beam emitted from the photocathode in accordance with a measurement result measured by the measurement unit.

15. The electron gun according to claim 12 further comprising a calculation unit configured to calculate a misalignment between a designed emission center axis of an electron beam and an electron beam emitted from the photocathode in accordance with a measurement result measured by the measurement unit.

16. The electron gun according to claim 12 further comprising a control unit configured to control a light source position adjustment member and/or a photocathode position adjustment member in accordance with a calculation result calculated by the calculation unit.

17. The electron gun according to claim 13 further comprising a control unit configured to control a light source position adjustment member and/or a photocathode position adjustment member in accordance with a calculation result calculated by the calculation unit.

18. The electron gun according to claim 14 further comprising a control unit configured to control a light source position adjustment member and/or a photocathode position adjustment member in accordance with a calculation result calculated by the calculation unit.

19. The electron gun according to claim 15 further comprising a control unit configured to control a light source position adjustment member and/or a photocathode position adjustment member in accordance with a calculation result calculated by the calculation unit.

20. The electron gun according to claim 2 further comprising an electron beam deflector configured to deflect an electron beam that passed through the electron beam shielding member in order to align an incident axis of a counterpart device to which the electron gun is mounted with an emission direction of an electron beam emitted from the electron gun.

* * * * *